(12) United States Patent
Yamaguchi

(10) Patent No.: US 7,287,312 B2
(45) Date of Patent: Oct. 30, 2007

(54) METHOD OF MANUFACTURING A MAGNETIC HEAD DEVICE

(75) Inventor: Satoshi Yamaguchi, Kwai Chung (HK)

(73) Assignee: SAE Magnetics (H.K.) Ltd., Kwai Chung, N.T. (HK)

( * ) Notice: Subject to any disclaimer, the term of this patent is extended or adjusted under 35 U.S.C. 154(b) by 353 days.

(21) Appl. No.: 10/790,497

(22) Filed: Mar. 1, 2004

(65) Prior Publication Data

US 2004/0228036 A1 Nov. 18, 2004

(30) Foreign Application Priority Data

Mar. 3, 2003 (JP) ............................. 2003-055496
Feb. 19, 2004 (JP) ............................. 2004-042728

(51) Int. Cl.
*G11B 5/48* (2006.01)
*B23K 26/20* (2006.01)

(52) U.S. Cl. ............................. 29/603.04; 29/603.03; 29/603.06; 29/840; 29/843; 228/232; 219/121.63; 219/121.64; 219/121.76

(58) Field of Classification Search ............. 29/603.04, 29/603.01, 603.03, 603.06, 840, 843, 860; 219/121.6, 121.61, 121.62, 121.63, 121.64, 219/121.76, 121.85; 228/232, 180.1; 360/264.2, 360/266.3, 244.1, 245.8
See application file for complete search history.

(56) References Cited

U.S. PATENT DOCUMENTS 5,828,031 A 10/1998 Pattanaik

2004/0228036 A1 11/2004 Yamaguchi
2005/0195527 A1 9/2005 Yamaguchi

FOREIGN PATENT DOCUMENTS

| JP | 2-246188 | * 10/1990 | ............ 219/121.62 |
|----|----------|-----------|------------------------|
| JP | 3-124368 | * 5/1991  | ............ 219/121.64 |
| JP | 5-226889 | * 9/1993  |                        |
| JP | 2002-050017 |  2/2002 |                        |

OTHER PUBLICATIONS

Shiraishi, M., "Chip on Suspension MR Head", 1998 IEMT/IMC Proceedings, Apr. 1998, pp. 333-336.*

* cited by examiner

*Primary Examiner*—A. Dexter Tugbang
(74) *Attorney, Agent, or Firm*—Oblon, Spivak, McClelland, Maier & Neustadt, P.C.

(57) ABSTRACT

A manufacturing method of a magnetic head device includes a preheating step of irradiating a laser beam to terminal pads of a magnetic head slider and to connection pads of a lead conductor member that is to be electrically connected to the magnetic head slider, a supply step of supplying conductive metal material for connecting the terminal pads and the connection pads during or after the preheating step, and a heating step of performing molten-metal connections between the terminal pads and the connection pads by irradiating a laser beam to the conductive metal material.

15 Claims, 20 Drawing Sheets

Fig. 23
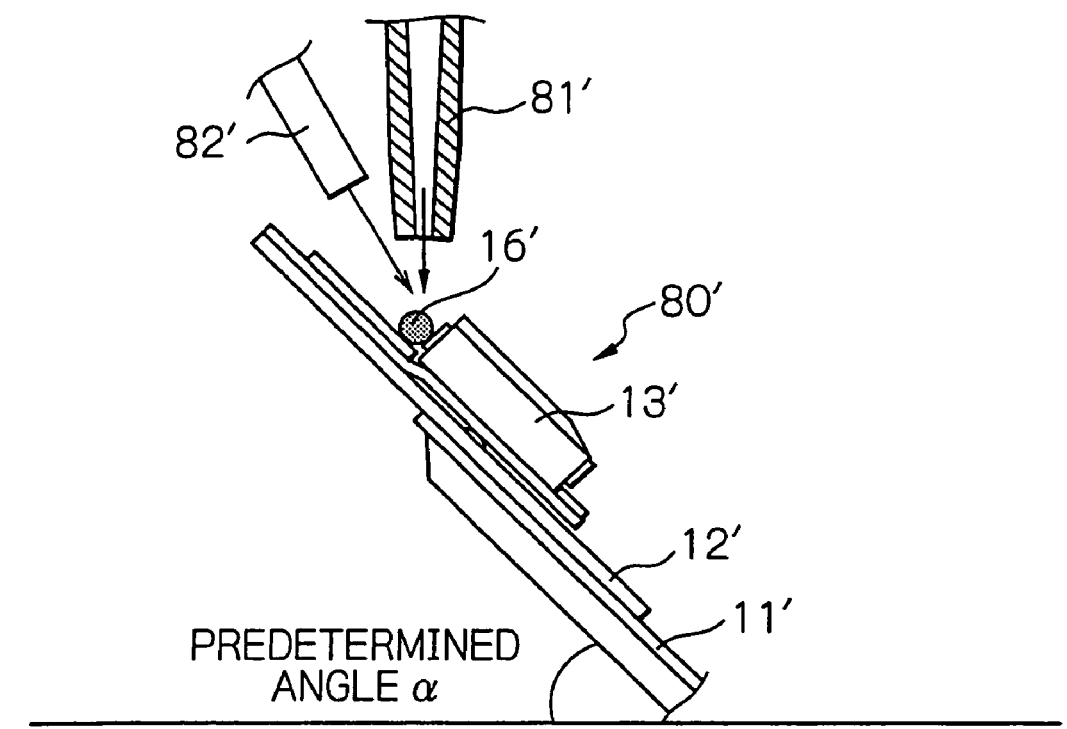
PREDETERMINED ANGLE α
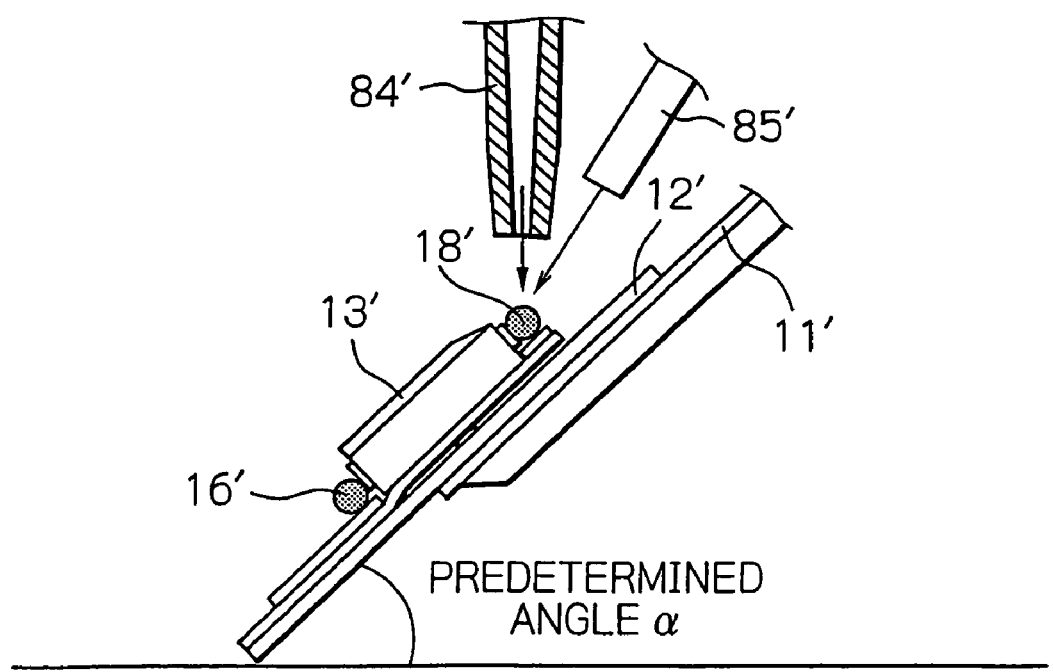
PREDETERMINED ANGLE α

METHOD OF MANUFACTURING A MAGNETIC HEAD DEVICE

BACKGROUND OF THE INVENTION

1. Field of the Invention

The present invention relates to a manufacturing method of a magnetic head device, to a manufacturing apparatus of a magnetic head device and to a magnetic head device. Particularly, the present invention relates to a manufacturing method and apparatus of a magnetic head device with a flying-type magnetic head slider with at least one magnetic write head element and/or at least one magnetic read head element and/or a micro-actuator, and to the magnetic head device.

2. Description of the Related Art

There are three practical variations of a flying-type magnetic head device in a magnetic disk drive apparatus, that is, a head gimbal assembly (HGA) with a suspension and a magnetic head slider attached on the suspension, a head arm assembly (HAA) with a support arm and at least one HGA attached to the support arm, and a head stack assembly (HSA) with a plurality of HAAs stacked on each other.

A typical HGA has a suspension and a magnetic head slider fixed on the suspension by a resin adhesive. Terminal pads of the magnetic head slider are electrically connected by solder with connection pads of trace conductors supported by the suspension. Thus, the magnetic head slider is fixed to the suspension by both the resin adhesive and the solder. Such structure is known by for example Japanese patent publication No. 2002-050017A.

A solder reflow method is known as for a method of electrically connecting terminal pads of a magnetic head slider and lead conductors of a suspension with each other and as for a method of detaching the magnetic head slider from the suspension in order to reuse. The solder reflow method is very popularly used for the solder connection because it is possible to provide high adhesion strength. Particularly, in the HGA process, a laser reflow method for reflowing the solder by means of a laser beam is utilized. Such laser reflow method is disclosed in for example Japanese patent publication No.2002-050017A and U.S. Pat. No. 5,828,031.

The laser reflow method disclosed in U.S. Pat. No. 5,828,031 has a process of providing a solder ball via a capillary to place it between the terminal pad of the magnetic head slider and the lead connection pad on the suspension, and a process of supplying a laser beam through the capillary to melt the solder ball so as to make solder connection between the terminal pad and the lead connection pad.

However, according to the known laser reflow method described in Japanese patent publication No.2002-050017A and U.S. Pat. No. 5,828,031, when performing solder connections, no solder wettability in the terminal pads of the magnetic head slider and the lead connection pads of the suspension is secured causing poor reliability in soldering electrical connections between the terminal pads and the lead connection pads.

If preheating of the whole of HGA is performed in order to ensure solder wettability, the magnetic head slider particularly the slider with a giant magnetoresistive effect (GMR) element may suffer from thermal damage.

In the conventional HGA, also, since the magnetic head slider is fixed to the suspension by both resin adhesive and solder, during the solder reflowing process for attaching or detaching the slider to or from the suspension, shape change in the magnetic head slider due to the difference in thermal expansion coefficients between the resin adhesive and the magnetic head slider may occur causing deterioration in the flying performance of the slider.

BRIEF SUMMARY OF THE INVENTION

It is therefore an object of the present invention to provide a manufacturing method and apparatus of a magnetic head device, whereby reliability of electrical connections between terminal pads of a magnetic head slider and lead connection pads of a suspension can be improved.

Another object of the present invention is to provide a manufacturing method and apparatus of a magnetic head device and a magnetic head device, whereby shape change of a magnetic head slider and damages applied to the slider during a solder reflow can be reduced.

According to the present invention, a manufacturing method of a magnetic head device includes a preheating step of irradiating a laser beam to terminal pads of a magnetic head slider and to connection pads of a lead conductor member that is to be electrically connected to the magnetic head slider, a supply step of supplying conductive metal material for connecting the terminal pads and the connection pads during or after the preheating step, and a heating step of performing molten-metal connections between the terminal pads and the connection pads by irradiating a laser beam to the conductive metal material.

Since the terminal pads and the connection pads are warmed by irradiating the laser beam during the preheating step or process, solder wettability of these terminal pads and connection pads can be secured without suffering thermal shape change or thermal damage to the magnetic head slider. Therefore, it is possible to improve reliability of electrical connections between the terminal pads and the lead connection pads.

It is preferred that the preheating step includes irradiating a laser beam with an irradiation energy controlled to secure wettability for connections of the conductive metal material.

It is also preferred that the preheating step includes irradiating a laser beam with an irradiation energy controlled to stepwise change with the lapse of time, from a low level to a high level.

It is further preferred that the preheating step includes irradiating a laser beam with an irradiation energy controlled so that a temperature of a magnetic head element of the magnetic head slider becomes 150° C. or less.

It is preferred that the supply step includes disposing or injecting the conductive metal material so that the conductive metal material abuts on at least either the terminal pads or the connection pads.

It is also preferred that the supply step includes supplying solder, solder with core inside, silver or gold.

It is preferred that the preheating step includes preheating dummy terminal pads formed on the magnetic head slider and dummy connection pads to be connected with the dummy terminal pads, that the supply step includes supplying conductive metal material for connecting the dummy terminal pads and the dummy connection pads, and that the heating step includes performing molten-metal connections between the dummy terminal pads and the dummy connection pads by irradiating a laser beam to the conductive metal material for connecting the dummy terminal pads and the dummy connection pads.

According to the present invention, also, a manufacturing apparatus of a magnetic head device includes a preheating unit for irradiating a laser beam to terminal pads of a magnetic head slider and to connection pads of a lead conductor member that is to be electrically connected to the magnetic head slider, a supply unit for supplying conductive metal material for connecting the terminal pads and the connection pads during or after the preheating step, and a heating unit for performing molten-metal connections between the terminal pads and the connection pads by irradiating a laser beam to the conductive metal material.

Since the terminal pads and the connection pads are warmed by irradiating the laser beam by means of the preheating unit, solder wettability of these terminal pads and connection pads can be secured without suffering thermal shape change or thermal damage to the magnetic head slider. Therefore, it is possible to improve reliability of electrical connections between the terminal pads and the lead connection pads.

It is preferred that the preheating unit includes a unit for irradiating a laser beam with an irradiation energy controlled to secure wettability for connections of the conductive metal material.

It is also preferred that the preheating unit includes a unit for irradiating a laser beam with an irradiation energy controlled to stepwise change with the lapse of time, from a low level to a high level.

It is further preferred that the preheating unit includes a unit for irradiating a laser beam with an irradiation energy controlled so that a temperature of a magnetic head element of the magnetic head slider becomes 150° C. or less.

It is preferred that the supply unit includes a unit for disposing or injecting the conductive metal material so that the conductive metal material abuts on at least either the terminal pads or the connection pads.

It is also preferred that the supply unit includes a unit for supplying solder, solder with core inside, silver or gold.

It is preferred that the preheating unit includes a unit for preheating dummy terminal pads formed on the magnetic head slider and dummy connection pads to be connected with the dummy terminal pads, that the supply unit includes a unit for supplying conductive metal material for connecting the dummy terminal pads and the dummy connection pads, and that the heating unit includes a unit for performing molten-metal connections between the dummy terminal pads and the dummy connection pads by irradiating a laser beam to the conductive metal material for connecting the dummy terminal pads and the dummy connection pads.

According to the present invention, furthermore, a magnetic head device includes a magnetic head slider with at least one magnetic head element and terminal pads electrically connected to the at least one magnetic head element, a suspension for supporting the magnetic head slider, a lead conductor member fixed to the suspension and provided with connection pads electrically connected to the at least one magnetic head element, at least one dummy terminal pad formed on the magnetic head slider, at least one dummy connection pad formed on the suspension or on the lead conductor member, and a connection unit for connecting the at least one dummy terminal pad and the at least one dummy connection pad.

Fixing of the magnetic head slider with the suspension is performed only by the dummy pads connection. Since no adhesive is used, it is possible to prevent shape change in the magnetic head slider due to the difference in thermal expansion coefficients between the resin adhesive and the magnetic head slider, and thus to prevent deterioration in the flying performance of the magnetic head slider.

It is preferred that the connection unit is molten-metal connection of a conductive metal material, or a molten-solder connection.

It is also preferred that the at least one dummy terminal pad is formed on a first surface of the magnetic head slider, the first surface being opposite to a second surface on which the terminal pads are formed.

Further objects and advantages of the present invention will be apparent from the following description of the preferred embodiments of the invention as illustrated in the accompanying drawings.

BRIEF DESCRIPTION OF THE SEVERAL VIEWS OF THE DRAWINGS

FIG. 23 is a side view illustrating a process of supplying a solder ball to a tilted HGA as a modification of the manufacturing method of FIGS. 19 to 22;

DETAILED DESCRIPTION OF THE INVENTION

Figure 1:
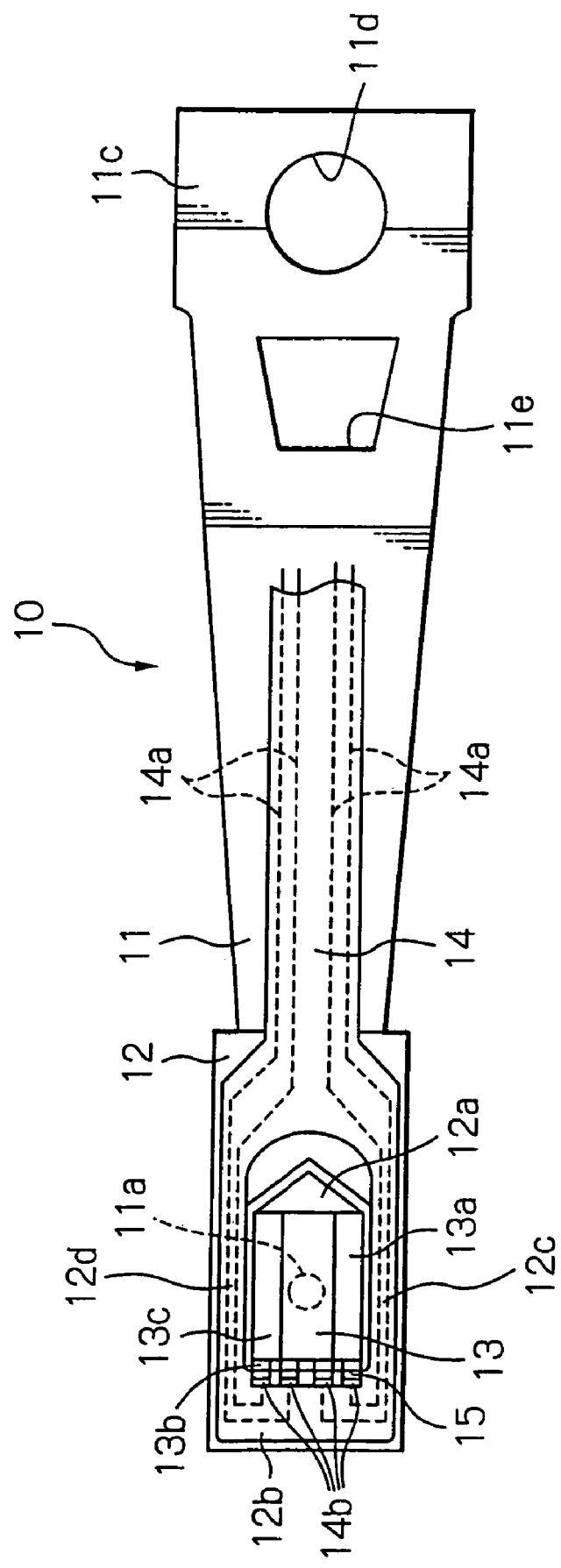
FIG. 1 is a plane view of an HGA seen from a slider-mounting side as a preferred embodiment of a magnetic head device according to the present invention.
Figure 2:
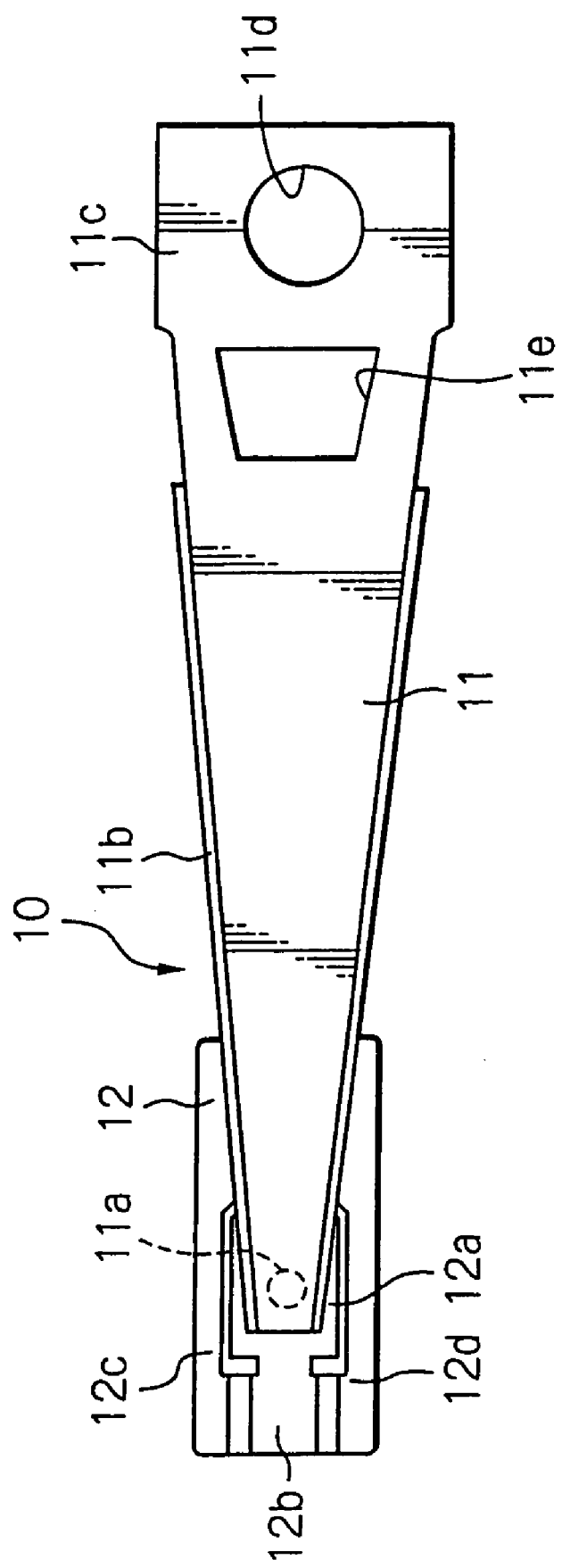
FIG. 2 is a plane view of the HGA shown in FIG. 1 seen from the opposite side of the slider-mounting side.
Figure 3:
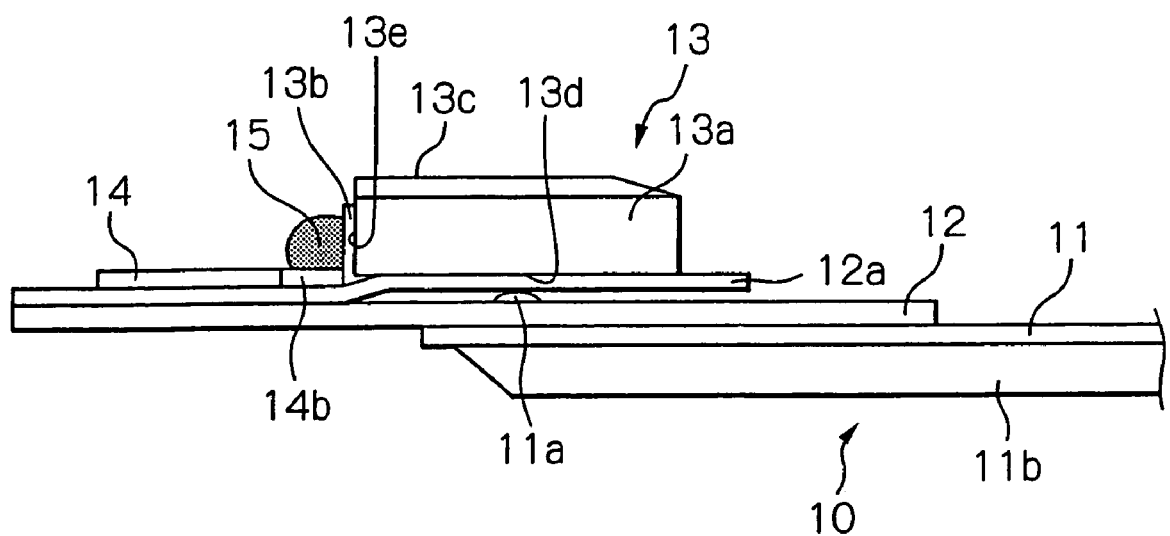
FIG. 3 is an enlarged side view of a top end section of the HGA shown in FIGS. 1 and 2.

FIG. 1 illustrates an HGA seen from a slider-mounting side as a preferred embodiment of a magnetic head device according to the present invention, FIG. 2 illustrates the HGA shown in FIG. 1 seen from the opposite side of the slider-mounting side, and FIG. 3 illustrates an enlarged top end section of the HGA shown in FIGS. 1 and 2.

As shown in these figures, the HGA has a suspension 10 mainly constituted by a load beam 11 with a relatively high stiffness and a resilient flexure 12, a magnetic head slider 13 fixed on the suspension 10, and a lead conductor member 14 formed on or fixed to the suspension 10.

The load beam 11 has a protrusion or dimple 11a for applying a load to the magnetic head slider 13. This dimple 11a is positioned on the longitudinal center axis line near a free end section or top end section of the load beam 11. As shown in FIGS. 2 and 3, the load beam 11 also has bent sections or ribs 11b at both side edges for increasing stiffness of the corresponding section of the load beam 11. The load beam 11 further has at its rear end section an attachment section 11c with an attachment via hole 11d used for fixing the load beam 11 to a support arm, and a via hole 11e, formed near the attachment via hole 11d, for reducing the whole weight of the load beam 11.

The flexure 12 is formed by a thin spring plate. One surface (first surface) of the flexure 12 is attached by swaging to a surface of the load beam 11, from which surface the protrusion 11a juts to receive a pressed load from the protrusion 11a. The magnetic head slider 13 is attached to the other surface (second surface) of the flexure 12. Instead of swaging, the flexure 12 may be attached by spot welding to the first surface of the load beam 11.

The flexure 12 has at its center a tongue 12a. Only one end of the tongue 12a is integrally coupled with a lateral frame 12b located at a top end of the flexure 12, and the other end of the tongue 12a is free end. Both ends of the lateral frame 12b are integrally coupled with outer frames 12c and 12d of the flexure 12, respectively. Side ends of the tongue 12a are separated from the outer frames 12c and 12d, and the other end of the tongue 12a is also separated from the flexure 12. Top end of the protrusion 11a of the load beam 11 abuts on one surface (first surface) of the tongue 12a. On the other surface (second surface) of the tongue 12a of the flexure 12, the magnetic head slider 13 is mechanically fixed only by solder connections between terminal pads of the magnetic head slider and connection pads of the lead conductor member, or by both the solder connections and adhesive connection.

The magnetic head slider 13 has a slider body 13a, a magnetic write head element of an inductive element in this embodiment, a magnetic read head element of a GMR element in this embodiment, and a plurality of (four in this case) terminal pads or bumps 13b electrically connected to these magnetic write and read head elements.

One surface 13d of the slider body 13a, opposite to its air bearing surface (ABS) 13c is attached to the other surface (second surface) of the tongue 12a of the flexure 12. On an element formed surface 13e of the slider body 13a, the terminal pads 13b are formed.

The lead conductor member 14 is supported by the flexure 12 and the load beam 11 of the suspension 10 and has a plurality of (four in this case) trace conductors 14a, and a plurality of (four in this case) connection pads or lead pads 14b. The trace conductors 14a are embedded in a flexible insulation support layer and one ends of the trace conductors 14a are connected to the respective connection pads 14b. These connection pads 14b are formed on the flexure 12 at locations corresponding to these of the terminal pads 13b of the magnetic head slider 13, respectively. Typical example of such lead conductor member 14 is a so-called tub tape.

The terminal pads 13b of the magnetic head slider 13 and the connection pads 14b of the lead conductor member 14 are connected with each other by reflowed solders 15, respectively. Each reflowed solder 15 is formed by laser reflowing of a solder ball supplied at a corner between the second surface of the flexure 12 and the element formed surface 13e of the slider body 13a. By means of this solder connection of the terminal pads 13b of the magnetic head slider 13 with the connection pads 14b of the lead conductor member 14, the magnetic write head element and the magnetic read head element of the magnetic head slider 13 are electrically connected with the trace conductors 14a of the lead conductor member 14.

If the write magnetic head element and/or the read magnetic head element of the magnetic head slider do not satisfy a predetermined characteristics, the solder 15 is re-molten so that the magnetic head slider 13 is detachable from the flexure 12 of the suspension 10.

In this embodiment, the terminal pads 13b of the magnetic head slider 13 and the connection pads 14b of the lead conductor member 14 are connected by the reflowed solder. According to the present invention, however, silver paste or gold ball bonding may be used instead of the reflowed solder. Furthermore, solder balls with cores, in each which a resin core is coated by a solder layer, such as Micropearl SOL provided from Sekisui Chemical Co., Ltd. may be used. In this case, the core may be made of a metal material.

Since the solder balls are placed at corners between the tongue 12a of the flexure 12 and the element formed surface 13e of the slider body 13a, heat such as laser beam heat applied from outside can be concentrated to the solder balls. Thus, during the solder reflow process for solder connections or detachment of the magnetic head slider 13, possible thermal damage to the GMR element on the magnetic head slider 13 can be minimized. If the magnetic head slider 13 is fixed to the suspension 10 only by the solder connections with using no resin adhesive, it is possible to prevent shape change in the magnetic head slider due to the difference in thermal expansion coefficients between the resin adhesive and the magnetic head slider, and thus to prevent deterioration in the flying performance of the slider.

Figure 4:
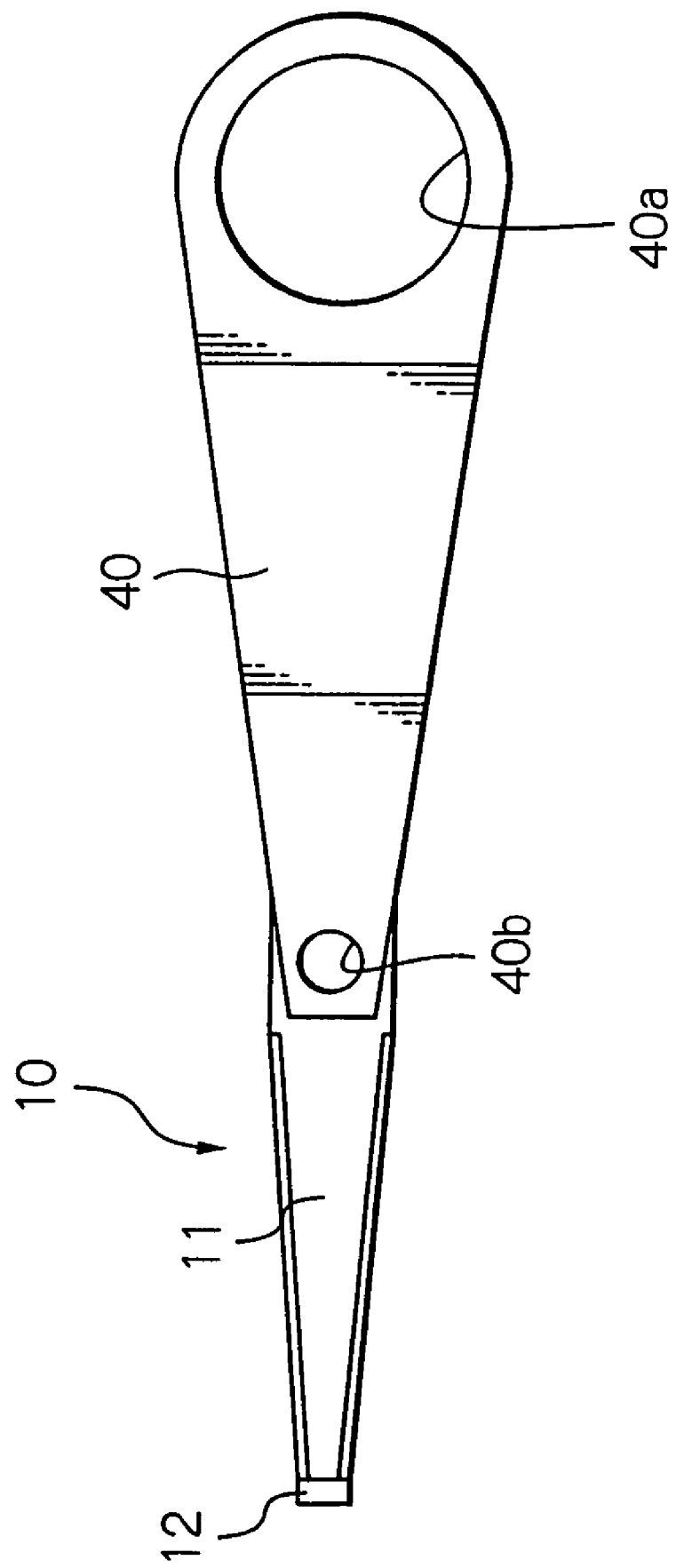
FIG. 4 is a plane view of an HAA constituted by attaching the HGA in the embodiment of FIG. 1 to a support arm, seen from the opposite side of the slider-mounting side.
Figure 5:
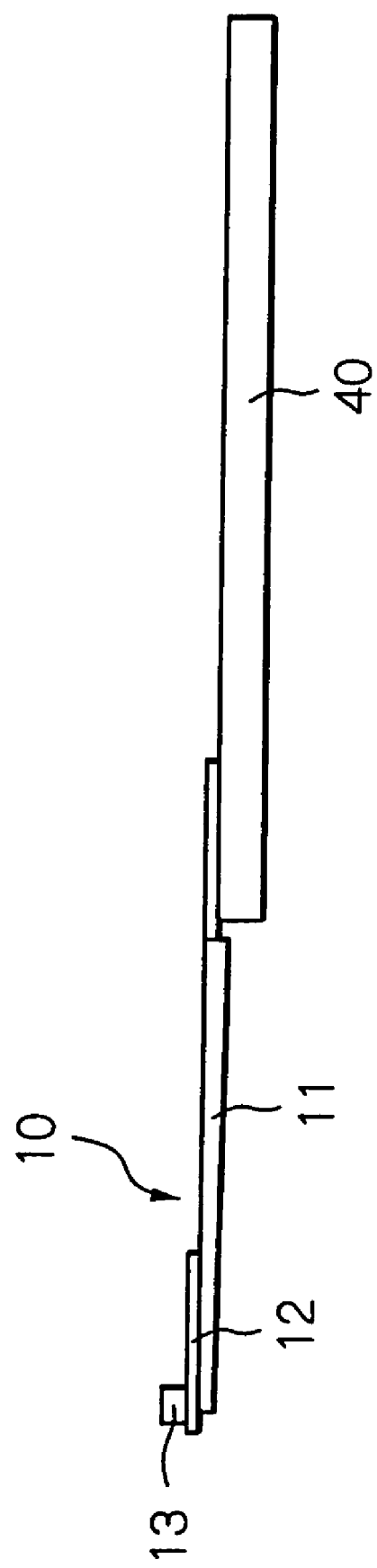
FIG. 5 is a side view of the HAA shown in FIG. 4.

FIG. 4 illustrates an HAA constituted by attaching the HGA to a support arm, seen from the opposite side of the slider-mounting side, and FIG. 5 shows the side view of the HAA.

As shown in these figures, the HAA is mainly configured by the HGA with the suspension 10 and the magnetic head slider 13, and the support arm 40. The support arm 40 is integrally formed or molded by an appropriate nonmagnetic metal material with a high stiffness such as an aluminum alloy for example. This support arm 40 has attachment holes 40a and 40b. The attachment hole 40a is used for attaching this support arm 40 to a bearing mechanism that allows the arm 40 to rotate around the bearing mechanism in parallel with the disk surface. The attachment hole 40b is used for attaching the HGA to this support arm 40. Namely, the attachment via hole 11d (FIGS. 1 and 2) of the HGA is attached to the attachment hole 40b by a swaging mechanism or a ball-connection mechanism for example to fix the HGA to the support arm 40.

Figure 6:
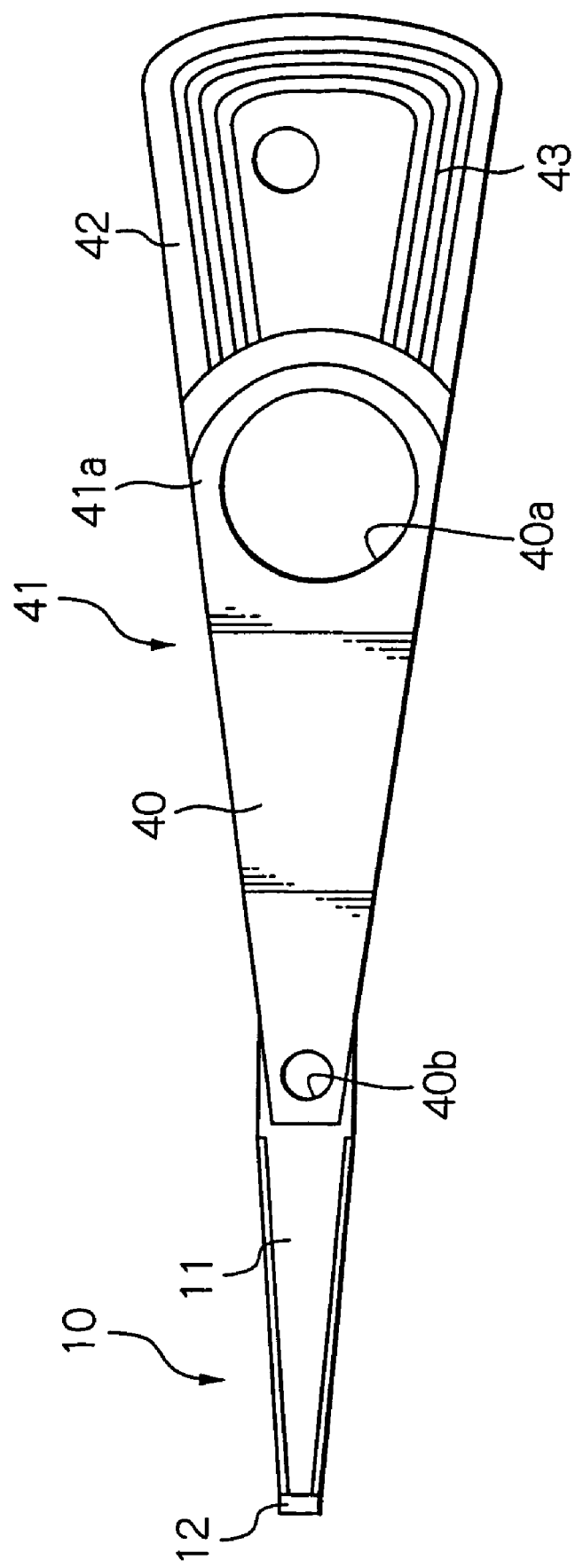
FIG. 6 is a plane view of an HSA constituted by stacking a plurality of the HAAs shown in FIGS. 4 and 5, seen from the opposite side of the slider-mounting side.
Figure 7:
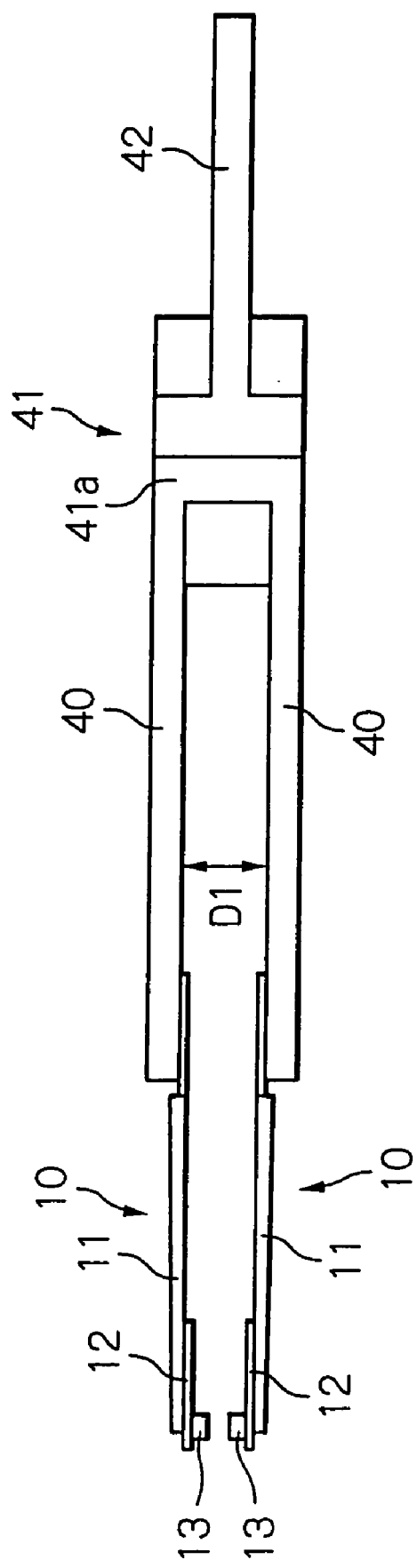
FIG. 7 is a side view of the HSA shown in FIG. 6.

FIG. 6 illustrates an HSA constituted by stacking a plurality of the HAAs shown in FIGS. 4 and 5, seen from the opposite side of the slider-mounting side, and FIG. 7 shows a side view of the HAS.

As shown in these figures, the HSA is mainly configured by a plurality, two in this case, of the HGAs each having the suspension 10 and the magnetic head slider 13, and a support block 41. The support block 41 has a plurality, two in this case, of the support arms 40. These two support arms 40 are protruded from a base 41a of the support block 41 in parallel with each other, and stacked at a space D1 away. At a top end section of each support arm 40, the HGA is attached as aforementioned. The base 41a and the support arms 40 are integrally formed or molded by an appropriate nonmagnetic metal material such as an aluminum alloy for example. The number of the stacked support arms may be three or more.

The base 41a has an attachment hole 40a running along the stacking direction of the support arms 40. This attachment hole 40a is used for attaching the support block 41 to a bearing mechanism that allows the block 41 to rotate around the bearing mechanism in parallel with the disk surface. To the base 41a of the support block 41, a coil support member 42 and a voice coil 43 of a voice coil motor (VCM) used for positioning the magnetic head slider 13 are attached.

In the embodiment shown in the figures, the single HGA is attached to one surface of each support arm 40. However, two HGAs may be attached to both surfaces of each support arm 40, respectively. In most cases of three or more support arms 40 are provided, two HGAs are attached to both surfaces of each support arm 40.

Hereinafter, manufacturing processes of the HGA of this embodiment according to the present invention will be described.

Figure 8:
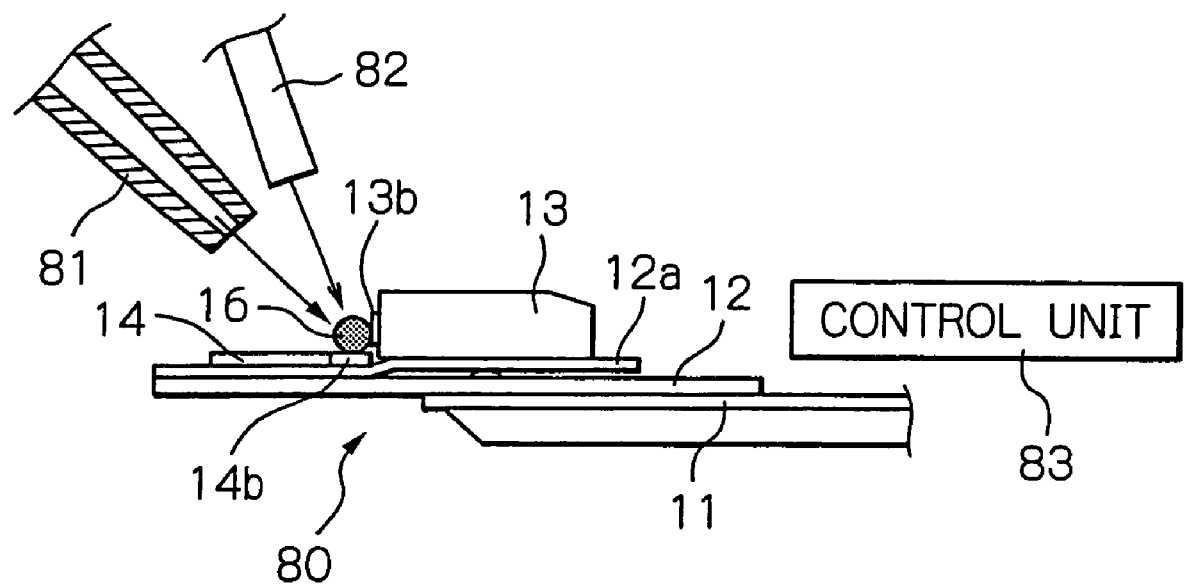
FIG. 8 is a side view illustrating schematic structure of a manufacturing apparatus used for fabricating the HGA of the embodiment of FIG. 1.

FIG. 8 illustrates schematic structure of a manufacturing apparatus used for fabricating the HGA of this embodiment.

As shown in the figure, the manufacturing apparatus of an HGA 80 is provided with a solder ball supply unit or connection ball supply unit 81, a laser beam supply unit 82 and a control unit 83 for controlling these units 81 and 82.

The HGA 80 itself has the structure as shown in FIGS. 1-3. The present invention can be adopted in the HGA itself, the HAA shown in FIGS. 4 and 5, the HSA shown in FIGS. 6 and 7, and a magnetic disk drive apparatus with the HAA or HSA.

The solder ball supply unit 81 supplies solder balls 16 to junctions between the terminal pads 13b of the magnetic head slider 13 and the connection pads 14b of the lead conductor member 14, respectively. This unit 81 may be for example a Solder Ball Bumper (SBB) of Pac Tech GmbH (URL:www.pactech.de), or a Solder Jet Printer System (SJPS) of MicroFab Technologies, Inc. (URL:www.microfab.com). The SBB places the solder balls on the junctions, whereas the SJPS injects molten solder balls to the junctions.

The laser beam supply unit 82 irradiates a focused laser beam to each of the junctions between the terminal pads 13b of the magnetic head slider 13 and the connection pads 14b of the lead conductor member 14, and to the solder balls 16 supplied to the junctions by the solder ball supply unit 81. As for the laser beam supply unit 82, a YAG laser beam supply unit or other laser beam supply unit can be adopted. However, it is desired to use one that can control an irradiation energy amount, irradiation timing, an irradiation frequency and a focal length.

In stead of the single laser beam supply unit in which the irradiation energy of the laser beam is variably controlled, a plurality of laser beam supply units including a first supply unit for irradiating a laser beam with a high energy that can melt the solder ball and a second supply unit for irradiating a laser beam with a low energy that will clean solder connection junctions.

The control unit 83 controls a supply timing of the solder ball at each solder ball supply unit 81, and controls an irradiation energy amount (output level and duration), an irradiation timing, an irradiation frequency and a focal length of each laser beam supply unit 82.

FIGS. 9 to 12 illustrate parts of the manufacturing method using the manufacturing apparatus of FIG. 8. Hereinafter, an embodiment of the manufacturing method will be described with reference to these figures that show only the minimum parts required for explaining the processes.

Figure 9:
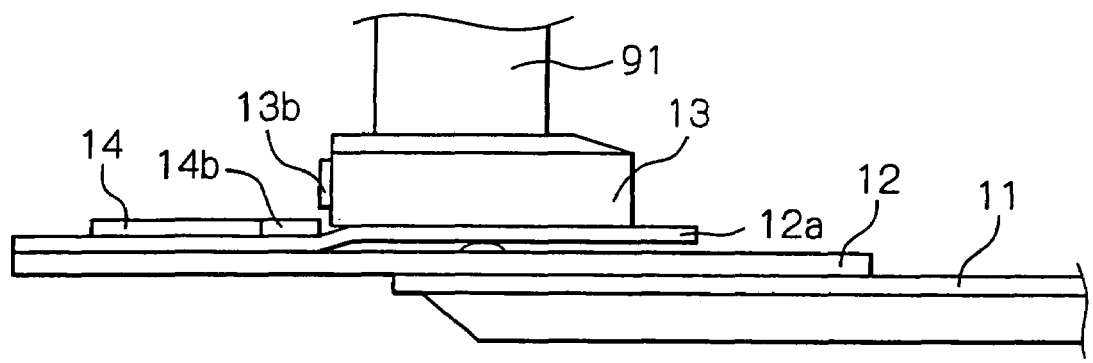
FIG. 9 is a side view illustrating a part of a manufacturing method using the manufacturing apparatus shown in FIG. 8.

First, as shown in FIG. 9, the magnetic head slider 13 is placed at a predetermined position on the suspension 10, namely at a predetermined position on the tongue 12a of the flexure 12, by using a jig 91.

Figure 10:
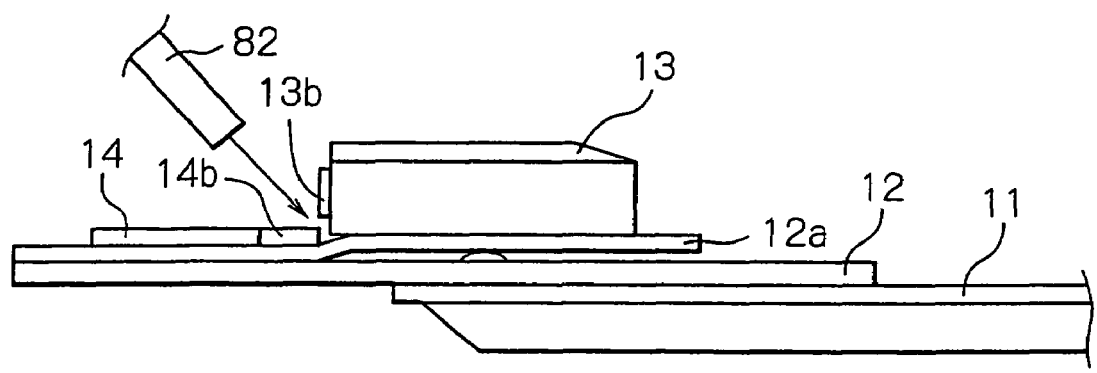
FIG. 10 is a side view illustrating a part of the manufacturing method using the manufacturing apparatus shown in FIG. 8.

Then, as shown in FIG. 10, in response to instructions from the control unit 83, a laser beam with a relatively low energy is irradiated from the laser beam supply unit 82 to the four terminal pads 13b of the magnetic head slider 13 and to the four connection pads 14b of the lead conductor member 14 (to four pairs of pads) so as to perform a preheating process for securing solder wettability. In this embodiment, a single laser beam from the laser beam supply unit 82 covers the four pairs of pads, that is the four terminal pads 13b and the four connection pads 14b so that the preheating is performed by one irradiation of the laser beam. In this case, an irradiation area of the laser beam should be determined to the minimum area required to cover the four terminal pads 13b and the four connection pads 14b in consideration of the thermal influence on the slider body 13a.

When preheating, each pair of pads may be independently irradiated by scanning a single laser beam or a plurality of pairs of pads may be simultaneously irradiated by the respective laser beams instead of one irradiation of the large laser beam.

Figure 11:
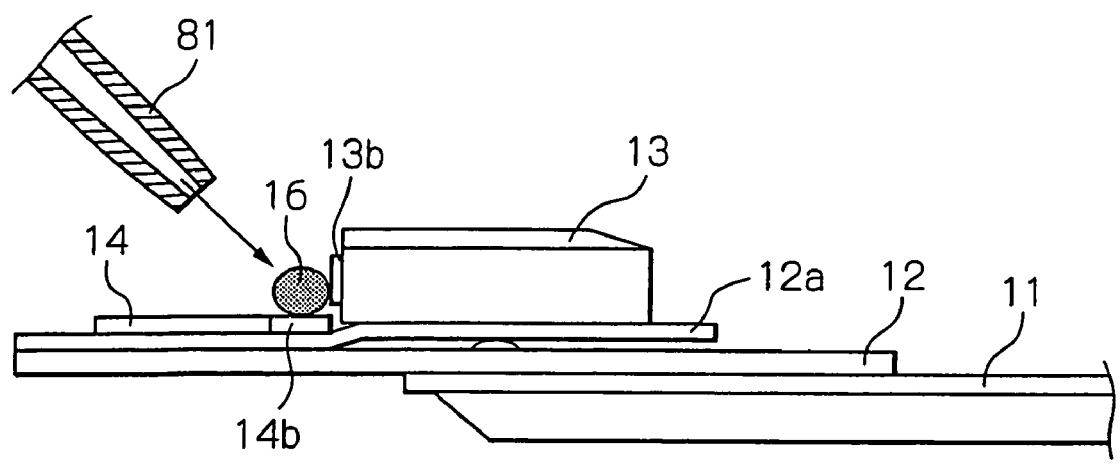
FIG. 11 is a side view illustrating a part of the manufacturing method using the manufacturing apparatus shown in FIG. 8.

Then, as shown in FIG. 11, in response to instructions from the control unit 83, solder balls 16 are supplied onto four pairs of pads that consist of the four terminal pads 13b of the magnetic head slider 13 and to the four connection pads 14b of the lead conductor member 14 from the solder ball supply unit 101 at predetermined timing.

Figure 12:
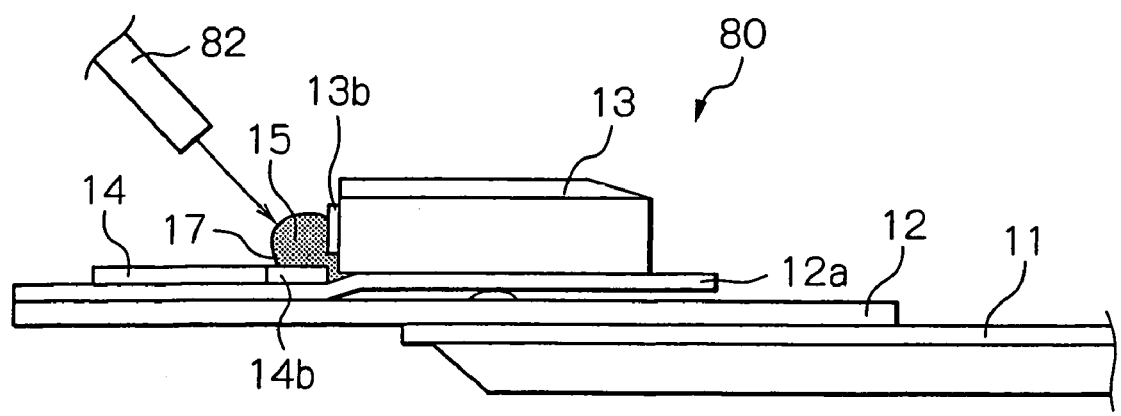
FIG. 12 is a side view illustrating a part of the manufacturing method using the manufacturing apparatus shown in FIG. 8.

Thereafter, as shown in FIG. 12, a laser beam with enough energy for melting the solder is irradiated from the laser beam supply unit 82 to the solder balls 16 so as to perform a heating process. Thus, at this heating process, the four terminal pads 13b and the four connection pads 14b are electrically and mechanically connected with each other by the reflowed solder 17 and therefore the magnetic head slider 13 is fixed on the suspension 10 to complete the HGA 80.

In this embodiment, a single laser beam from the laser beam supply unit 82 covers the four pairs of pads, that is the four terminal pads 13*b* and the four connection pads 14*b* so that the heating process is performed by one irradiation of the laser beam.

For the heating process, however, each pair of pads may be independently irradiated by scanning a single laser beam or a plurality of pairs of pads may be simultaneously irradiated by the respective laser beams instead of one irradiation of the large laser beam.

Figure 13:
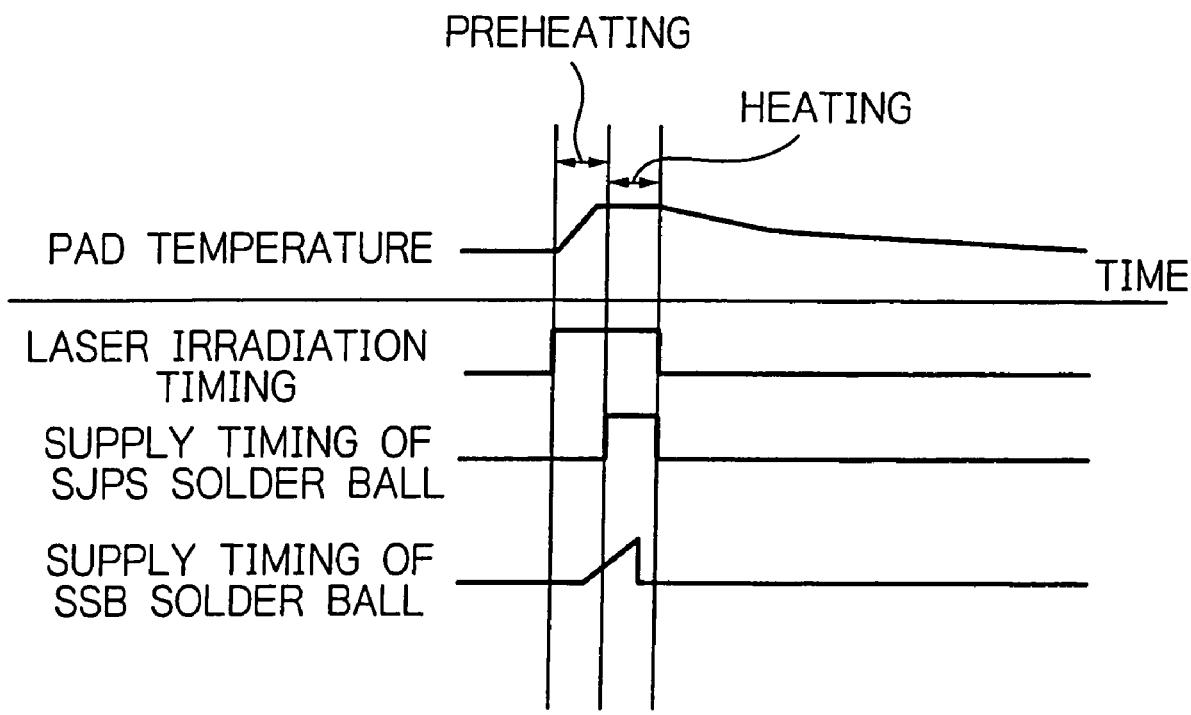
FIG. 13 is a timing chart illustrating timings from a preheating process to a solder ball supply process.

FIG. 13 illustrates timings of processes from a preheating to a solder ball supply. Hereinafter, the timings of the preheating to the solder ball supply controlled by the control unit 83 are described with reference to this figure.

First, the preheating process is executed by irradiating the laser beam to the pairs of pads so that the temperature of the magnetic head element rises to an adequate temperature. This adequate temperature is determined to 150° C. or less in order to give no thermal damage to the magnetic head element and the slider body 13*a*, but to a temperature capable of securing solder wettability for the pads. A time period of the preheating process varies depending upon irradiation energy and a frequency of the laser beam.

After the preheating process is started, a solder ball is supplied at timing when the temperature will reach the adequate temperature. This supply timing of the solder ball differs depending upon kinds of the solder ball supply unit 81. As shown in FIG. 13 in a supply unit with a relatively quick response time for solder ball supplying such as for example SJPS, the solder ball supply will start after the temperature rises to the adequate temperature. Whereas, in a solder ball unit with a relatively slow response time for solder ball supplying such as for example SSB, the solder ball supply will start before the temperature rises to the adequate temperature in consideration of the time lag.

The laser beam supply unit 82 is controlled by the control unit 83 to supply the laser beam with controlled irradiation energies so that the process sequentially shifts from the preheating process to the heating process and to an annealing process executed thereafter.

In modifications, laser beams with different irradiation energies may be used for the preheating process, the heating process and the annealing process, respectively, or laser beams with the same irradiation energy may be used with different irradiation time periods for the preheating process, the heating process and the annealing process. During the preheating process, the irradiation energy of the laser beam may be stepwise changed with the lapse of time. For example, the irradiation energy may be changed from a low level for cleaning the pad surfaces to a high level for raising the pad temperature.

According to the above-mentioned manufacturing method, since the preheating is executed, solder wettability of the terminal pads of the magnetic head slider and the connection pads of the lead conductor member can be secured without suffering thermal shape change or thermal damage to the slider body. Therefore, it is possible to improve reliability of electrical connections between these terminal pads and the lead connection pads. If the solder reflow is repeated after the aforementioned manufacturing method, the reliability can be further improved.

In case that the solder balls are supplied by injection as done in SJPS, since reliability of electrical connections will reduced if the pads are not warmed, the above-mentioned manufacturing method with the preheating process is particularly effective.

Figure 14:
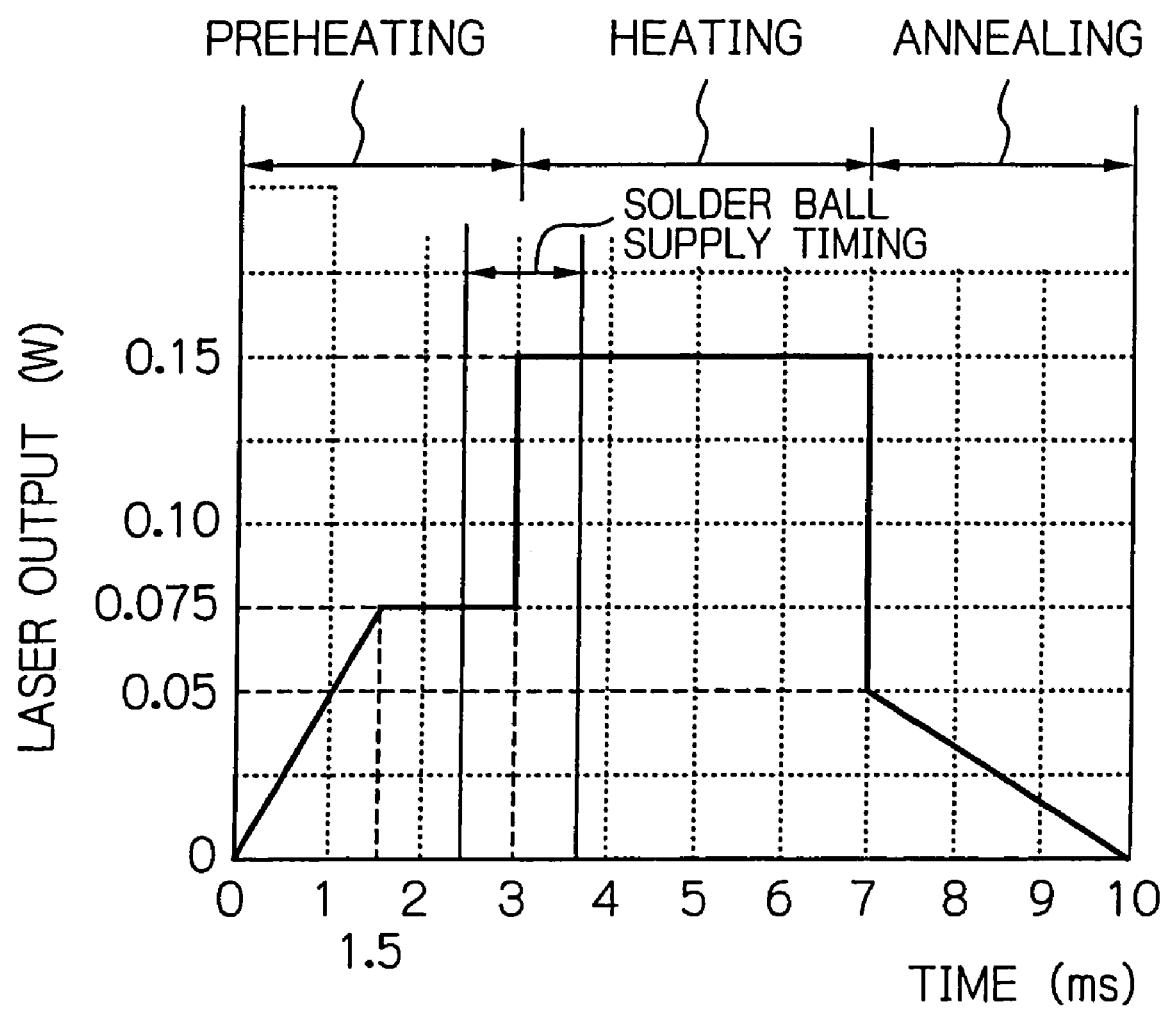
FIG. 14 is a chart illustrating an example of laser output control from a preheating process to an annealing process.

FIG. 14 illustrates an example of laser output control from the preheating process to the heating process and to an annealing process executed thereafter. In the figure, the lateral axis indicates a time (ms) and the longitudinal axis indicates a laser output (W). In this example, sizes of the terminal pad and the connection pads are 0.13 mm×0.13 mm, a spot diameter of the laser beam is 0.15-0.2 mm, and a diameter of the solder ball is 0.12 mm. The laser source is a YAG laser with a wavelength of 1064 nm.

As shown in the figure, the irradiation time period in the preheating process is controlled to 3.0 ms in this example. Namely, the laser output is gradually increased from 0 to 0.075 W during a period of 0-1.5 ms, and the laser output is maintained constant at 0.075 W during a period of 1.5-3.0 ms. Such a control of the laser output can reduce the load applied to a laser beam supply unit to prevent its breakdown. However, it is possible to control the laser output to gradually increase during a period of 1.5-3.0 ms as shown in FIG. 13, or alternately it is possible to maintain a constant laser output of 0.075 W during a period of 0-3.0 ms.

As shown in FIG. 14, the irradiation time period in the heating process is controlled to 4.0 ms in this example. Namely, the laser output is increased to 0.15 W during a period of 3.0-7.0 ms to reflow the solder ball. It is desired that the solder ball is supplied during a period of 2-4 ms containing therein the timing of 3 ms as shown in the figure.

As shown in the figure, the irradiation time period in the annealing process is controlled to 3.0 ms in this example. Namely, the laser output is gradually decreased from 0.05 W during a period of 7.0-10.0 ms to anneal the solder connection portions.

Figure 15:
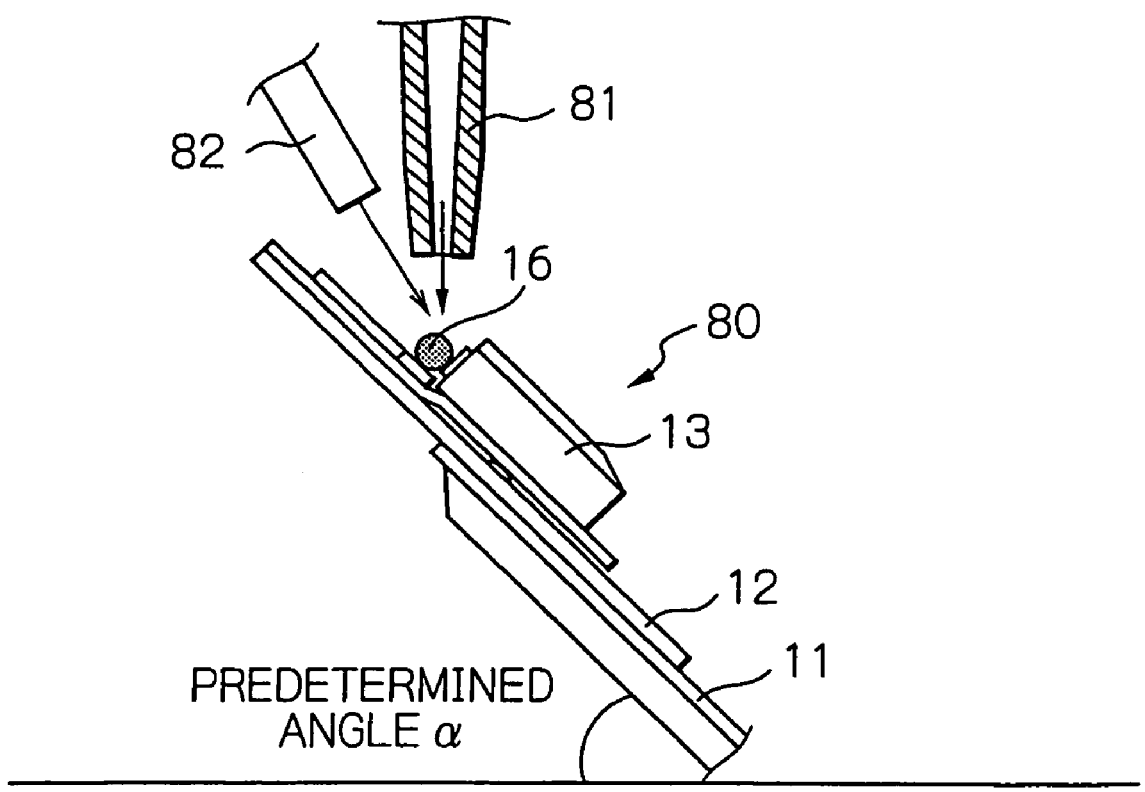
FIG. 15 is a side view illustrating a process of supplying a solder ball to a tilted HGA as a modification of the manufacturing method of FIGS. 9 to 12.

In modification of the above-mentioned manufacturing method, a solder ball 16 may be supplied as shown in FIG. 15 while keeping the HGA 80 tilted by a predetermined angle a such as 45 degrees with respect to the horizontal direction. This modification will reduce a deviation in the supplied position of the solder ball 16.

Figure 16:
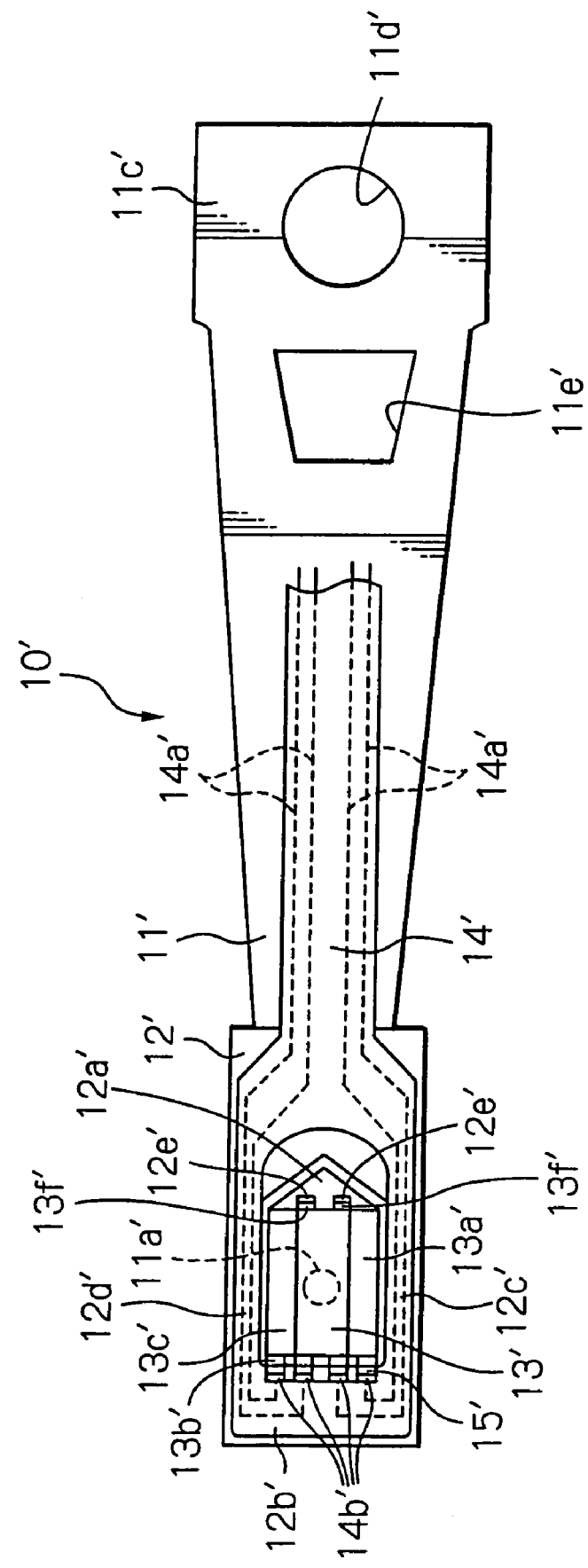
FIG. 16 is a plane view of an HGA seen from a slider-mounting side as another embodiment of a magnetic head device according to the present invention.
Figure 17:
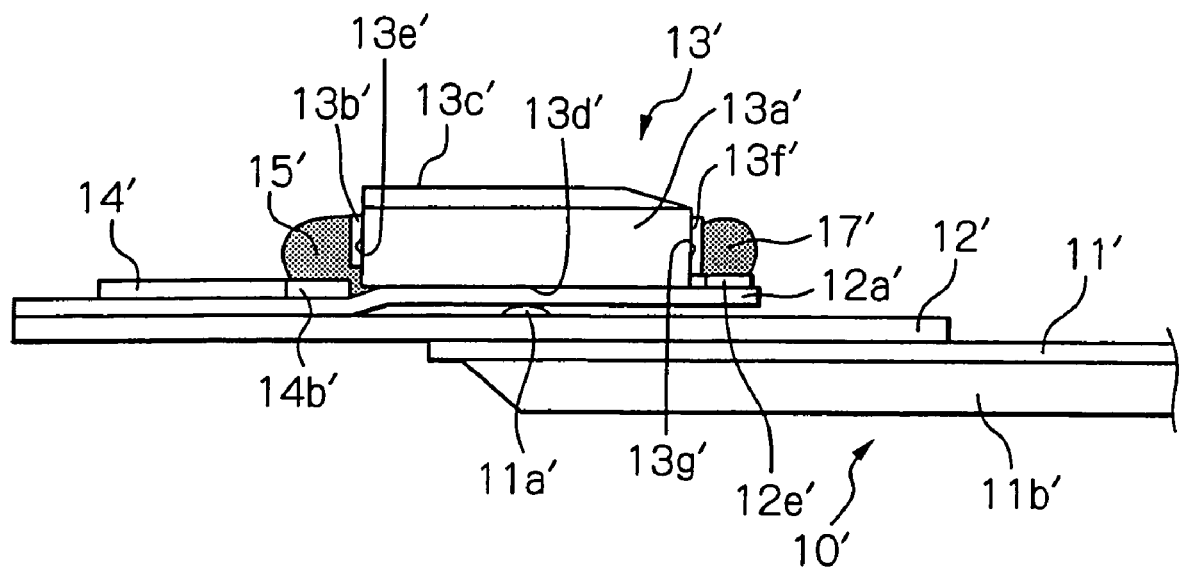
FIG. 17 is an enlarged side view of a top end section of the HGA shown in FIG. 16.

FIG. 16 illustrates an HGA seen from a slider-mounting side as another embodiment of a magnetic head device according to the present invention, and FIG. 17 illustrates an enlarged top end section of the HGA shown in FIG. 16.

As shown in these figures, the HGA has a suspension 10' mainly constituted by a load beam 11' with a relatively high stiffness and a resilient flexure 12', a magnetic head slider 13' fixed on the suspension 10', and a lead conductor member 14' formed on or fixed to the suspension 10'.

The load beam 11' has a protrusion or dimple 11*a*' for applying a load to the magnetic head slider 13'. This dimple 11*a*' is positioned on the longitudinal center axis line near a free end section or top end section of the load beam 11'. As shown in FIG. 17, the load beam 11' also has bent sections or ribs 11*b*' at both side edges for increasing stiffness of the corresponding section of the load beam 11'. The load beam 11' further has at its rear end section an attachment section 11*c*' with an attachment via hole 11*d*' used for fixing the load beam 11' to a support arm, and a via hole 11*e*', formed near the attachment via hole 11*d*', for reducing the whole weight of the load beam 11'.

The flexure 12' is formed by a thin spring plate. One surface (first surface) of the flexure 12' is attached by swaging to a surface of the load beam 11', from which surface the protrusion 11*a*' juts to receive a pressed load from the protrusion 11*a*'. The magnetic head slider 13' is attached to the other surface (second surface) of the flexure 12'. Instead of swaging, the flexure 12' may be attached by spot welding to the first surface of the load beam 11'.

The flexure 12' has at its center a tongue 12*a*'. Only one end of the tongue 12*a*' is integrally coupled with a lateral frame 12*b*' located at a top end of the flexure 12', and the other end of the tongue 12*a*' is free end. Both ends of the lateral frame 12b' are integrally coupled with outer frames 12c' and 12d' of the flexure 12', respectively. Side ends of the tongue 12a' are separated from the outer frames 12c' and 12d', and the other end of the tongue 12a' is also separated from the flexure 12'. Top end of the protrusion 11a' of the load beam 11' abuts on one surface (first surface) of the tongue 12a'. On the other surface (second surface) of the tongue 12a' of the flexure 12', a plurality of (two in this case) dummy pads 12e' are formed. The magnetic head slider 13' is mechanically fixed to the flexure 12' by solder connections between the dummy pads 12e' and dummy terminal pads 13f' of the magnetic head slider 13'. The dummy pads 12e' are directly formed on the tongue 12a' of the flexure 12' and thus grounded. These dummy pads 12e' are solder-connected with the dummy terminal pads 13f' of the magnetic head slider 13'. Therefore, the dummy terminal pads 13f' are grounded. If the dummy pads 12e' are formed on the lead conductor member, by grounding these dummy pads 12e', the dummy terminal pads 13f' of the magnetic head slider 13' are grounded.

The magnetic head slider 13' has a slider body 13a', a magnetic write head element of an inductive element in this embodiment, a magnetic read head element of a GMR element in this embodiment, a plurality of (four in this case) terminal pads or bumps 13b' electrically connected to these magnetic write and read head elements, and a plurality of (two in this case) the dummy terminal pads 13f'.

One surface 13d' of the slider body 13a', which is opposite to its ABS 13c', is attached to the other surface (second surface) of the tongue 12a' of the flexure 12'. On an element formed surface 13e' of the slider body 13a', the terminal pads 13b' are formed. The dummy terminal pads 13f' are formed on another surface 13g' of the slider body 13a', opposite to the element formed surface 13e'.

The lead conductor member 14' is supported by the flexure 12' and the load beam 11' of the suspension 10' and has a plurality of (four in this case) trace conductors 14a', and a plurality of (four in this case) connection pads or lead pads 14b'. The trace conductors 14a' are embedded in a flexible insulation support layer and one ends of the trace conductors 14a' are connected to the respective connection pads 14b'. These connection pads 14b' are formed on the flexure 12' at locations corresponding to these of the terminal pads 13b' of the magnetic head slider 13', respectively. Typical example of such lead conductor member 14' is a so-called tub tape.

The terminal pads 13b' of the magnetic head slider 13' and the connection pads 14b' of the lead conductor member 14' are connected with each other by reflowed solders 15', respectively. Each reflowed solder 15' is formed by laser reflowing of a solder ball supplied at a corner between the second surface of the flexure 12' and the element formed surface 13e' of the slider body 13a'. The dummy terminal pads 13f' of the magnetic head slider 13' and the dummy pads 12e' formed on the tongue 12a' of the flexure 12' are connected with each other by reflowed solders 17', respectively. Each reflowed solder 17' is formed by laser reflowing of a solder ball supplied at a corner between the second surface of the flexure 12' and the surface 13g' opposite to the element formed surface 13e' of the slider body 13a'. By these solder connections only, the magnetic head slider 13' is fixed to the tongue 12a' of the flexure 12'. No adhesive is used. By means of the solder connection between the terminal pads 13b' of the magnetic head slider 13' and the connection pads 14b' of the lead conductor member 14', the magnetic write head element and the magnetic read head element of the magnetic head slider 13' are electrically connected with the trace conductors 14a' of the lead conductor member 14'.

In this embodiment, the terminal pads 13b' of the magnetic head slider 13' and the connection pads 14b' of the lead conductor member 14' are connected by the reflowed solder. According to the present invention, however, silver paste or gold ball bonding may be used instead of the reflowed solder. Furthermore, solder balls with cores, in each which a resin core is coated by a solder layer, such as Micropearl SOL provided from Sekisui Chemical Co., Ltd. may be used. In this case, the core may be made of a metal material.

Since the solder balls are placed at corners between the second surface of the tongue 12a' of the flexure 12' and the element formed surface 13e' of the slider body 13a' and at corners between the second surface of the tongue 12a' of the flexure 12' and the opposite surface 13g' of the slider body 13a', heat such as laser beam heat applied from outside can be concentrated to the solder balls. Thus, during the solder reflow process for solder connections or detachment of the magnetic head slider 13', possible thermal damage to the GMR element on the magnetic head slider 13' can be minimized. If the magnetic head slider 13' is fixed to the suspension 10' only by the solder connections with using no resin adhesive, it is possible to prevent shape change in the magnetic head slider due to the difference in thermal expansion coefficients between the resin adhesive and the magnetic head slider, and thus to prevent deterioration in the flying performance of the slider.

An HAA with a support arm and the above-mentioned HGA attached to the support arm, and an HSA with a plurality of stacked HAAs can be similarly adopted as these in the embodiment of FIG. 1.

Hereinafter, manufacturing processes of the HGA of this embodiment according to the present invention will be described.

Figure 18:
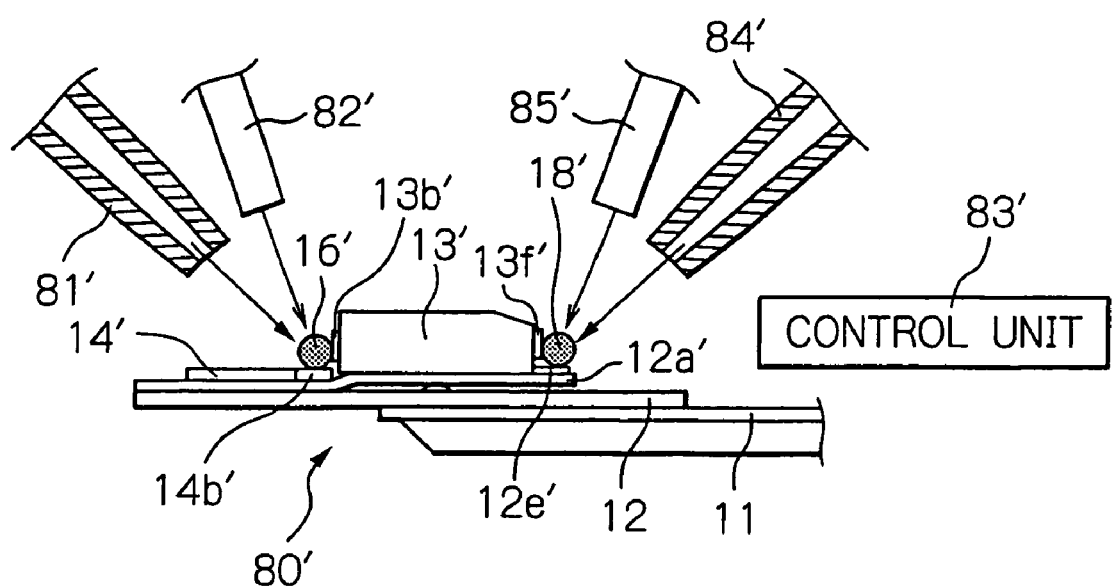
FIG. 18 is a side view illustrating schematic structure of a manufacturing apparatus used for fabricating the HGA of the embodiment of FIG. 16.

FIG. 18 illustrates schematic structure of a manufacturing apparatus used for fabricating the HGA of this embodiment.

As shown in the figure, the manufacturing apparatus of an HGA 80' is provided with solder ball supply units or connection ball supply units 81' and 84', laser beam supply units 82' and 85' and a control unit 83' for controlling these units 81', 82', 84' and 85'.

The HGA 80' itself has the structure as shown in FIGS. 16 and 17. The present invention can be adopted in the HGA itself, the HAA similar to that shown in FIGS. 4 and 5, the HSA similar to that shown in FIGS. 6 and 7, and a magnetic disk drive apparatus with the HAA or HSA.

The solder ball supply unit 81' supplies solder balls 16' to junctions between the terminal pads 13b' of the magnetic head slider 13' and the connection pads 14b' of the lead conductor member 14', respectively. The solder ball supply unit 84' supplies solder balls 18' to junctions between the dummy terminal pads 13f' of the magnetic head slider 13' and the dummy pads 12e' formed on the tongue 12a' of the flexure 12', respectively. Each of these units 81' and 84' may be for example a Solder Ball Bumper (SBB) of Pac Tech GmbH, or a Solder Jet Printer System (SJPS) of MicroFab Technologies, Inc. As mentioned before, the SBB places the solder balls on the junctions, whereas the SJPS injects molten solder balls to the junctions.

The laser beam supply unit 82' irradiates a focused laser beam to each of the junctions between the terminal pads 13b' of the magnetic head slider 13' and the connection pads 14b' of the lead conductor member 14', and to the solder balls 16' supplied to the junctions by the solder ball supply unit 81'. The laser beam supply unit 85' irradiates a focused laser beam to each of the junctions between the dummy terminal pads 13f′ of the magnetic head slider 13′ and the dummy pads 12e′ formed on the tongue 12a′ of the flexure 12′, and to the solder balls 18′ supplied to the junctions by the solder ball supply unit 84′. As for each of the laser beam supply units 82′ and 85′, a YAG laser beam supply unit or other laser beam supply unit can be adopted. However, it is desired to use one that can control an irradiation energy amount, irradiation timing, an irradiation frequency and a focal length.

In stead of the single laser beam supply unit for each in which the irradiation energy of the laser beam is variably controlled, a plurality of laser beam supply units including a first supply unit for irradiating a laser beam with a high energy that can melt the solder ball and a second supply unit for irradiating a laser beam with a low energy that will clean solder connection junctions.

The control unit 83′ controls a supply timing of the solder ball at each of the solder ball supply units 81′ and 84′, and controls an irradiation energy amount (output level and duration), an irradiation timing, an irradiation frequency and a focal length of each of the laser beam supply units 82′ and 85′.

FIGS. 19 to 22 illustrate parts of the manufacturing method using the manufacturing apparatus of FIG. 18. Hereinafter, an embodiment of the manufacturing method will be described with reference to these figures that show only the minimum parts required for explaining the processes.

Figure 19:
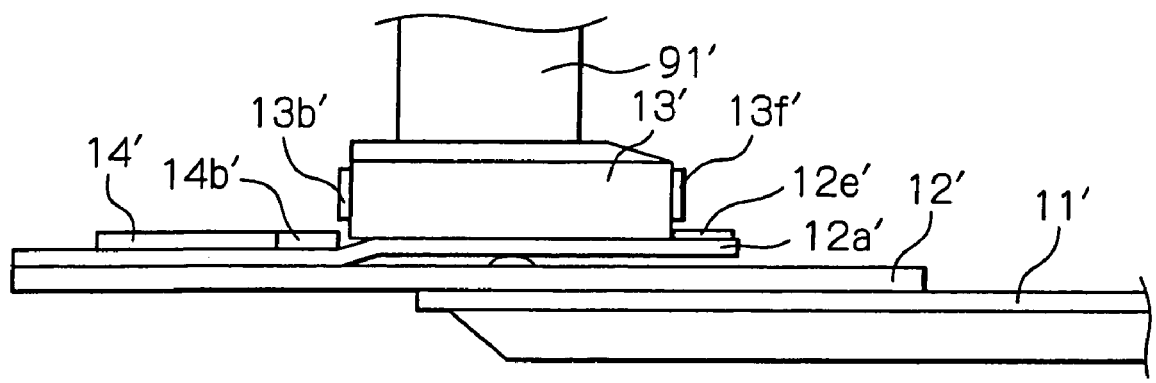
FIG. 19 is a side view illustrating a part of a manufacturing method using the manufacturing apparatus shown in FIG. 18.

First, as shown in FIG. 19, the magnetic head slider 13′ is placed at a predetermined position on the suspension 10′, namely at a predetermined position on the tongue 12a′ of the flexure 12′, by using a jig 91′.

Figure 20:
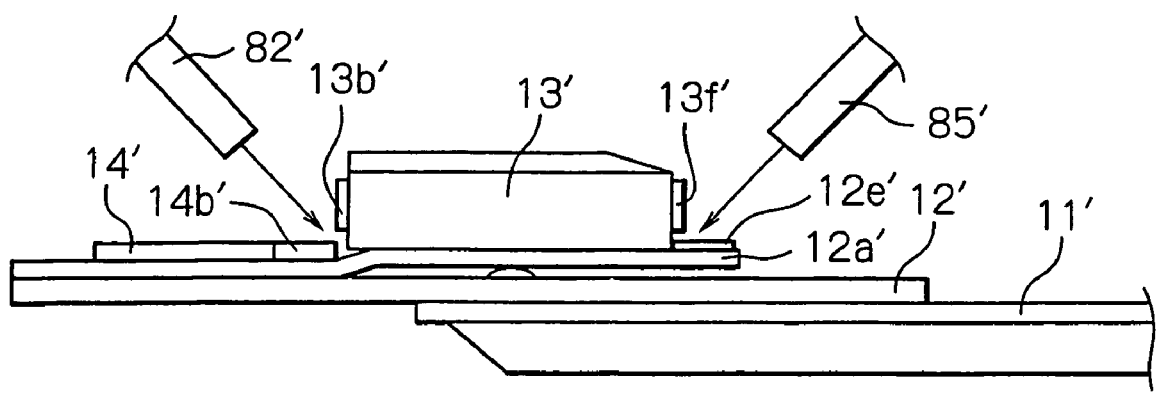
FIG. 20 is a side view illustrating a part of the manufacturing method using the manufacturing apparatus shown in FIG. 18.

Then, as shown in FIG. 20, in response to instructions from the control unit 83′, a laser beam with a relatively low energy is irradiated from the laser beam supply unit 82′ to the four terminal pads 13b′ of the magnetic head slider 13′ and to the four connection pads 14b′ of the lead conductor member 14′ (to four pairs of pads) so as to perform a preheating process for securing solder wettability. In this embodiment, a single laser beam from the laser beam supply unit 82′ covers the four pairs of pads, that is the four terminal pads 13b′ and the four connection pads 14b′ so that the preheating process is performed by one irradiation of the laser beam. In this case, an irradiation area of the laser beam should be determined to the minimum area required to cover the four terminal pads 13b′ and the four connection pads 14b′ in consideration of the thermal influence on the slider body 13a′.

Similarly, a laser beam with a relatively low energy is irradiated from the laser beam supply unit 85′ to the two dummy terminal pads 13f′ and the two dummy pads 12e′ (to two pairs of pads) so as to perform a preheating process for securing solder wettability. In this embodiment, a single laser beam from the laser beam supply unit 85′ covers the two pairs of pads, that is the two dummy terminal pads 13f′ and the two dummy pads 12e′ so that the preheating process is performed by one irradiation of the laser beam. In this case, an irradiation area of the laser beam should be determined to the minimum area required to cover the two dummy terminal pads 13f′ and the two dummy pads 12e′ in consideration of the thermal influence on the slider body 13a′.

The preheating of the four terminal pads 13b′ and the four connection pads 14b′ and the preheating of the two dummy terminal pads 13f′ and the two dummy pads 12e′ may be simultaneously executed by the respective laser beam supply units 82′ and 85′. These preheating can be separately executed by the single laser beam supply unit 82′ or 85′. When preheating, each pair of pads may be independently irradiated by scanning a single laser beam or a plurality of pairs of pads may be simultaneously irradiated by the respective laser beams instead of one irradiation of the large laser beam.

Figure 21:
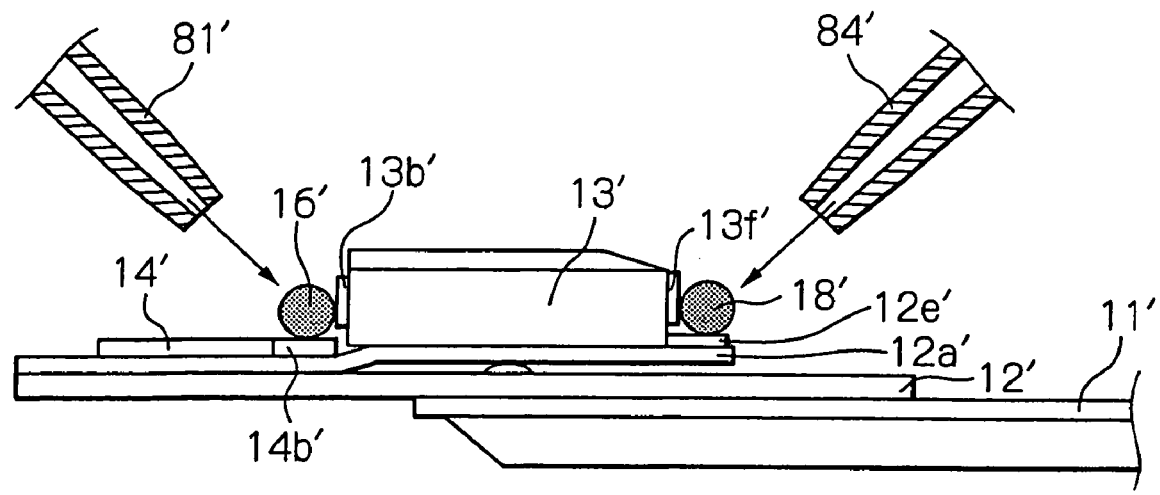
FIG. 21 is a side view illustrating a part of the manufacturing method using the manufacturing apparatus shown in FIG. 18.

Then, as shown in FIG. 21, in response to instructions from the control unit 83′, solder balls with cores 16′ and 18′ are supplied onto four pairs of pads that consist of the four terminal pads 13b′ and the four connection pads 14b′ and onto two pairs of pads that consist of the two dummy terminal pads 13f′ and the two dummy pads 12e′ from the solder ball supply units 81′ and 84′, respectively, at predetermined timing.

Figure 22:
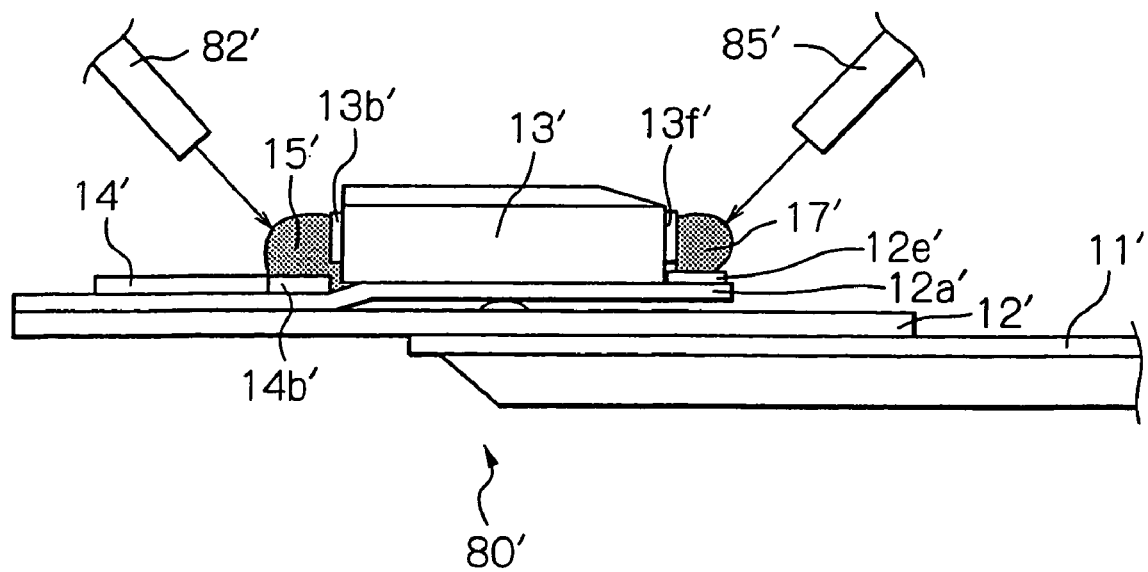
FIG. 22 is a side view illustrating a part of the manufacturing method using the manufacturing apparatus shown in FIG. 18.

Thereafter, as shown in FIG. 22, laser beams with an enough energy for melting the solder is irradiated from the laser beam supply units 82′ and 85′ to the respective solder balls with cores 16′ and 18′ so as to perform a heating process. Thus, at this heating process, the four terminal pads 13b′ and the four connection pads 14b′ are electrically and mechanically connected with each other by the reflowed solder 15′, and the two dummy terminal pads 13f′ and the two dummy pads 12e′ are mechanically connected with each other by the reflowed solder 17′. Therefore, the magnetic head slider 13′ is fixed on the suspension 10′ to complete the HGA 80′.

In this embodiment, a single laser beam from the laser beam supply unit 82′ covers the four pairs of pads, that is the four terminal pads 13b′ and the four connection pads 14b′ so that the heating is performed by one irradiation of the laser beam. Also, a single laser beam from the laser beam supply unit 85′ covers the two pairs of pads, that is the two dummy terminal pads 13f′ and the two dummy pads 12e′ so that the heating is performed by one irradiation of the laser beam.

For the heating process, however, each pair of pads may be independently irradiated by scanning a single laser beam or a plurality of pairs of pads may be simultaneously irradiated by the respective laser beams instead of one irradiation of the large laser beam.

Timings of processes from a preheating to a solder ball supply controlled by the control unit 83′ are the same as that described with reference to FIG. 13 in the embodiment of FIG. 1.

The laser beam supply units 82′ and 85′ are controlled by the control unit 83′ to supply the laser beams with controlled irradiation energies so that each process sequentially shifts from the preheating process to the heating process and the annealing process executed thereafter. In modifications, laser beams with different irradiation energies may be used for the preheating process and the heating process, respectively, or laser beams with the same irradiation energy may be used with different irradiation time periods for the preheating process and the heating process, respectively. During the preheating, the irradiation energy of each laser beam may be stepwise changed with the lapse of time. For example, the irradiation energy may be changed from a low level for cleaning the pad surfaces to a high level for raising the pad temperature.

Laser output control during the preheating process, the heating process and the annealing process in this embodiment is the same as that described with reference to FIG. 14 in the embodiment of FIG. 1.

According to the above-mentioned manufacturing method, since the preheating is executed, solder wettability of the terminal pads and the dummy terminal pads of the magnetic head slider, the connection pads of the lead conductor member and the dummy pads can be secured without suffering thermal shape change or thermal damage to the slider body. Therefore, it is possible to improve reliability of electrical connections between the terminal pads and the lead connection pads and reliability of mechanical connections between the dummy terminal pads and the dummy pads. If the solder reflow is repeated after the aforementioned manufacturing method, the reliability can be further improved.

In case that the solder balls are supplied by injection as done in SJPS, since reliability of electrical connections will reduced if the pads are not warmed, the above-mentioned manufacturing method with the preheating process is particularly effective.

Such preheating of the pads may be adopted in not only the manufacturing method of the HGA in which the magnetic head slider is fixed to the suspension only by the solder connections but also a manufacturing method of another type HGA including an HGA in which a magnetic head slider is fixed to a suspension by both solder connections and adhesive connections.

In modification of the above-mentioned manufacturing method, solder balls 16' and 18' may be supplied as shown in FIG. 23 while keeping the HGA 80' tilted by a predetermined angle α such as 45 degrees with respect to the horizontal direction. This modification will reduce a deviation in the supplied positions of the solder balls 16' and 18'.

Figure 24:
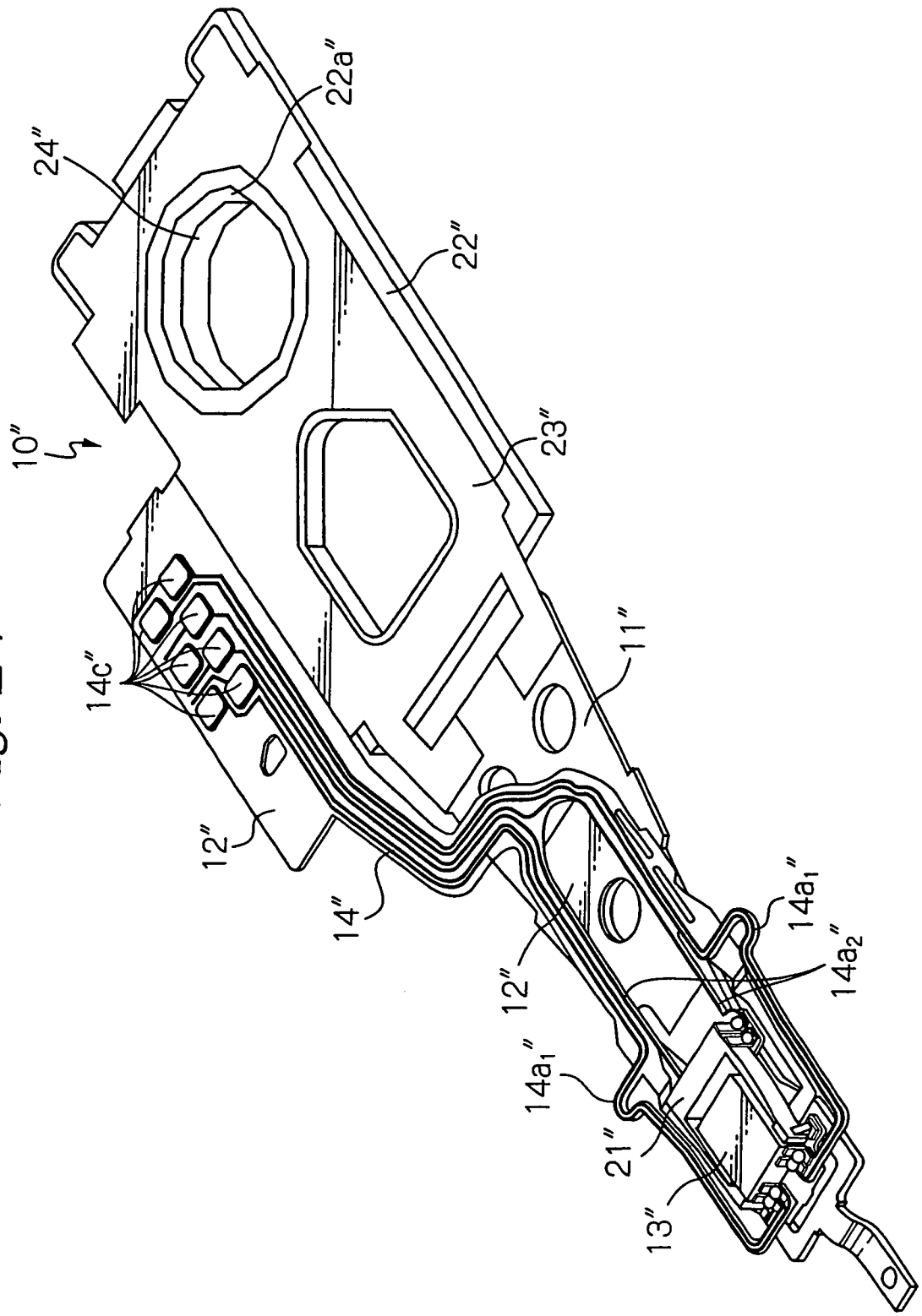
FIG. 24 is a plane view of an HGA seen from a slider-mounting side as further embodiment of a magnetic head device according to the present invention.
Figure 25:
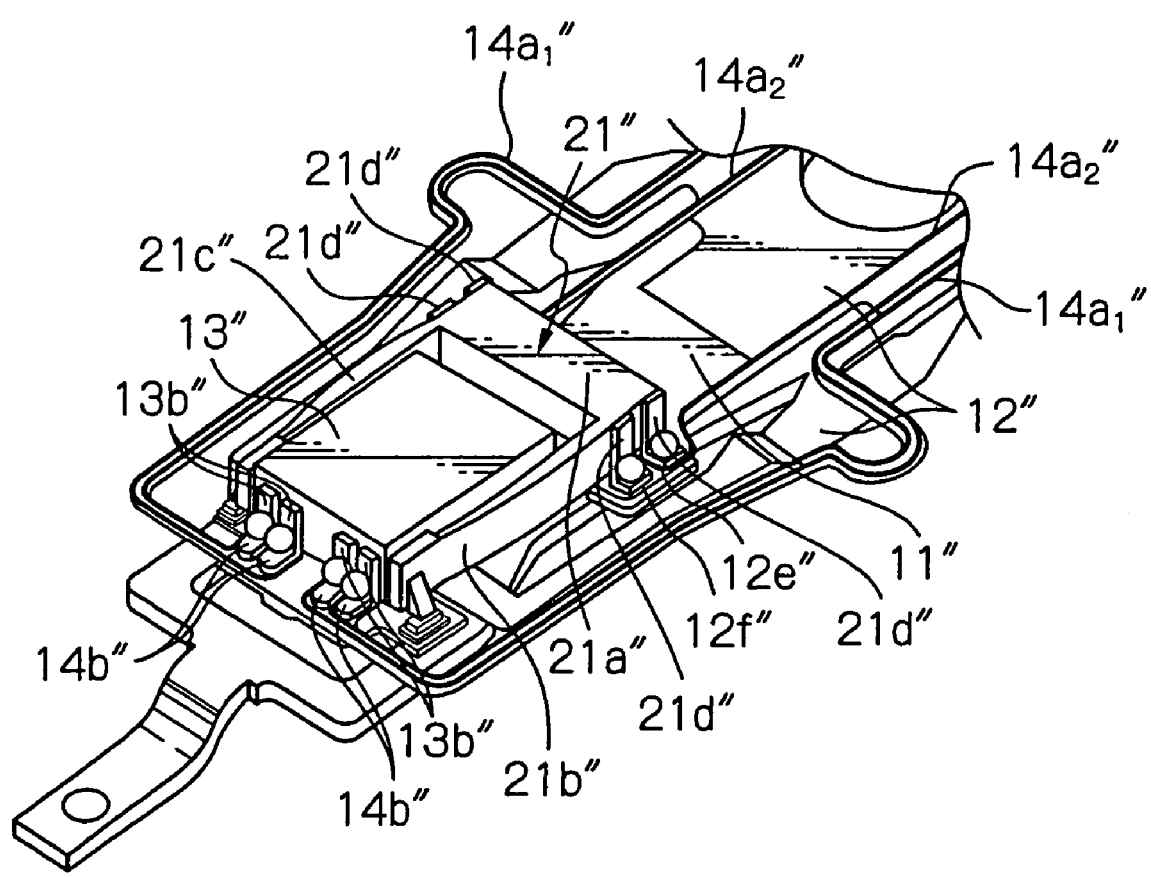
FIG. 25 is an enlarged side view of a top end section of the HGA shown in FIG. 24.

FIG. 24 illustrates an HGA seen from a slider-mounting side as further embodiment of a magnetic head device according to the present invention, and FIG. 25 shows an enlarged top end section of the HGA shown in FIG. 24.

As shown in these figures, the HGA in this embodiment has a suspension 10", a precise positioning actuator or micro-actuator 21" fixed on the suspension 10", a magnetic head slider 13" fixed on the micro-actuator 21", and a lead conductor member 14" formed on or fixed to the suspension 10".

The suspension 10" is mainly constituted by first and second load beams 22" and 11" with a relatively high stiffness, a resilient hinge 23" for coupling these first and second load beams 22" and 11", a resilient flexure 12' fixed on and supported by the second load beam 11" and the hinge 23", and a ring shaped base plate 24" attached to an attachment hole 22a" of the first load beam 22".

The micro-actuator 21" is fixed to a top end section of the suspension 10" and supports side surfaces of the magnetic head slider 13" so as to precisely position the magnetic head elements, which is not available by the VCM.

More concretely, the micro-actuator 21" in this embodiment has a rough U-plane shape and consists of a base 21a" to be fixed to the suspension 10" and a pair of movable arms 21b" and 21c" perpendicularly extending from both side ends of the base 21a". Top end sections of the movable arms 21b" and 21c" are fixed to the side surfaces of the magnetic head slider 13". The movable arms 21b" and 21c" consist of arm members and piezoelectric elements formed on side surfaces of the arm members, respectively.

The base 21a" and the arm members of the actuator 21" are united by an elastic sintered ceramic such as $ZrO_2$ for example. In response to expansion and contraction of the piezoelectric elements, the movable arm 21b" and 21c" bend resulting the top end section of the arm 21b" and 21c" to laterally displace. Thus, the magnetic head element of the magnetic head slider 13" fixed to the actuator 21" can be precisely positioned.

The second load beam 11" has a protrusion or dimple (not shown) for applying a load to the magnetic head slider 13". This dimple is positioned on the longitudinal center axis line near a free end section or top end section of the load beam 11".

The flexure 12" is formed by a thin spring plate. One surface (first surface) of the flexure 12" is attached by swaging to a surface of the second load beam 11", from which surface the protrusion juts to receive a pressed load from the protrusion. The micro-actuator 21" is attached to the other surface (second surface) of the flexure 12". Instead of swaging, the flexure 12" may be attached by spot welding to the first surface of the second load beam 11".

The flexure 12" has at its center a tongue (not shown). Top end of the protrusion of the load beam 11" abuts on one surface (first surface) of the tongue. On the other surface (second surface) of the tongue of the flexure 12", an insulation layer is formed, and on this insulation layer, a plurality of (two in this case) actuator connection pads 12e" and a plurality of (two in this case) actuator ground pads 12f" are formed. The micro-actuator 21" is electrically connected to trace conductors and mechanically fixed to the flexure 12" by solder ball connections, that is, the connection using solder balls between terminal pads 21d" of the actuator 21", which are electrically connected across the piezoelectric elements, and the actuator connection pads 12e" and the actuator ground pads 12f", respectively.

The magnetic head slider 13" has a slider body 13a", a magnetic write head element of an inductive element in this embodiment, a magnetic read head element of a GMR element in this embodiment, and a plurality of (four in this case) terminal pads or bumps 13b" electrically connected to these magnetic write and read head elements.

The lead conductor member 14" has a plurality of (four in this case) head element trace conductors 14a$_1$', a plurality of (two in this case) actuator trace conductors 14a$_2$' one ends of which are respectively connected to the actuator connection pads 12e" and the actuator ground pads 12f", a plurality of (four in this case) head element connection pads 14b" respectively connected to one ends of the head element trace conductors 14a$_1$', and a plurality of (six in this case) external connection pads 14c" respectively connected to the other ends of the actuator trace conductors 14a$_2$'. This trace conductors 14a$_1$' and 14a$_2$' are embedded in a flexible insulation support layer of the lead conductor member 14". The head element connection pads 14b" are formed on the flexure 12" at locations corresponding to these of the terminal pads 13b" of the magnetic head slider 13", respectively.

The terminal pads 13b" of the magnetic head slider 13" and the head element connection pads 14b" of the lead conductor member 14" are solder-connected with each other by using reflowed solder balls.

In this embodiment, also, a preheating process, a heating process and an annealing process similar to these in the embodiments of FIGS. 1 and 16 are performed for securing solder connections between the terminal pads 21d" of the actuator 21" and the actuator connection pads 12e" and the actuator ground pads 12f", and solder connections between the terminal pads 13b" of the magnetic head slider 13" and the head element connection pads 14b" of the lead conductor member 14".

Furthermore, since the preheating is executed, solder wettability of the terminal pads of the magnetic head slider and the head element connection pads of the suspension, and solder wettability of the terminal pads of the actuator and the connection pads of the suspension can be secured without suffering thermal shape change or thermal damage to the slider body. Therefore, it is possible to improve reliability of electrical and mechanical connections between the terminal pads and the head element connection pads and reliability of electrical and mechanical connections between the actuator terminal pads and the actuator connection pads.

Also, since the solder balls are placed at corners between the second surface of the tongue of the flexure 12" and the side surfaces of the micro-actuator 21" and at corners between the second surface of the tongue of the flexure 12" and the element formed surface of the magnetic head slider 13", heat such as laser beam heat applied from outside can be concentrated to the solder balls. Thus, during the solder reflow process for solder connections or detachment of the micro-actuator 21" and the magnetic head slider 13", possible thermal damage to the GMR element on the magnetic head slider 13" can be minimized.

An HAA with a support arm and the above-mentioned HGA attached to the support arm, and an HSA with a plurality of stacked HAAs can be similarly adopted as these described in reference to the embodiment of FIG. 1.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A manufacturing method of a magnetic head device, comprising:
    preheating by irradiating, with a first laser beam, terminal pads of a magnetic head slider and connection pads of a lead conductor member that is to be electrically connected to the magnetic head slider;
    supplying conductive metal material for connecting said terminal pads and said connection pads during or after said preheating;
    heating so as to form molten-metal connections between said terminal pads and said connection pads by irradiating, with a second laser beam, said conductive metal material; and
    annealing the conductive metal material with a third laser beam after heating the conductive metal material such that laser energy applied during annealing gradually decreases.

2. The method as claimed in claim 1, wherein said preheating comprises irradiating the terminal pads and connection pads with an irradiation energy controlled to secure wettability for connections of said conductive metal material.

3. The method as claimed in claim 1, wherein said preheating comprises irradiating the terminal pads and connection pads with an irradiation energy controlled to stepwise change with a lapse of time, from a low level to a high level.

4. The method as claimed in claim 1, wherein said preheating comprises irradiating the terminal pads and connection pads with an irradiation energy controlled so that a temperature of a magnetic head element of said magnetic head slider becomes 150° C. or less.

5. The method as claimed in claim 1, wherein said supplying step comprises disposing or injecting said conductive metal material so that the conductive metal material abuts on at least either said terminal pads or said connection pads.

6. The method as claimed in claim 1, wherein said supplying step comprises supplying one of: solder with a core inside, silver or gold.

7. The method as claimed in claim 1, wherein said preheating step comprises preheating dummy terminal pads formed on said magnetic head slider and dummy connection pads to be connected with said dummy terminal pads, wherein said supply step comprises supplying conductive metal material for connecting said dummy terminal pads and said dummy connection pads, and wherein said heating step comprises performing molten-metal connections between said dummy terminal pads and said dummy connection pads by irradiating the second laser beam to said conductive metal material for connecting said dummy terminal pads and said dummy connection pads.

8. The method as claimed in claim 1, wherein the first laser beam is the second laser beam.

9. The method as claimed in claim 8, wherein the first laser beam, second laser beam, and third laser beam are the same laser beam.

10. The method as claimed in claim 1, wherein the first laser beam and second laser beam are emitted from a same laser beam supply unit.

11. The method as claimed in claim 1, wherein the terminal pads and connection pads are simultaneously preheated by the first laser beam.

12. The method as claimed in claim 1, wherein laser energy applied during heating is substantially constant.

13. The method as claimed in claim 12, wherein laser energy applied during preheating gradually increases until heating begins.

14. The method as claimed in claim 12, wherein a minimum laser energy applied during heating is higher than a maximum laser energy applied during annealing.

15. The method as claimed in claim 1, further comprising tilting the magnetic head device at an angle α such that the conductive metal material rests partially on the terminal pads and rests partially on the connection pads during heating.

\* \* \* \* \*